(12) United States Patent
Finn

(10) Patent No.: US 8,870,080 B2
(45) Date of Patent: *Oct. 28, 2014

(54) RFID ANTENNA MODULES AND METHODS

(71) Applicant: David Finn, Tourmakeady County Mayo (IE)

(72) Inventor: David Finn, Tourmakeady County Mayo (IE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 52 days.

This patent is subject to a terminal disclaimer.

(21) Appl. No.: 13/756,631

(22) Filed: Feb. 1, 2013

(65) Prior Publication Data

US 2013/0140370 A1   Jun. 6, 2013

Related U.S. Application Data

(63) Continuation-in-part of application No. 13/310,718, filed on Dec. 3, 2011, now Pat. No. 8,366,009, and a (Continued)

(51) Int. Cl.
*G06K 19/06* (2006.01)
*G06K 19/077* (2006.01)
*H01F 38/14* (2006.01)

(52) U.S. Cl.
CPC .... *G06K 19/07773* (2013.01); *G06K 19/07794* (2013.01); *G06K 19/077* (2013.01); *G06K 19/07747* (2013.01); *G06K 19/07756* (2013.01); *G06K 19/07769* (2013.01); *H01F 38/14* (2013.01)
USPC ......................................................... 235/492

(58) Field of Classification Search
USPC ......................................................... 235/492
See application file for complete search history.

(56) References Cited

U.S. PATENT DOCUMENTS

| 5,084,699 A | 1/1992 | DeMichele |
| 5,249,098 A | 9/1993 | Rostoker et al. |

(Continued)

FOREIGN PATENT DOCUMENTS

| CA | 2279176 | 7/1998 |
| DE | 39 35 364 | 8/1990 |

(Continued)

OTHER PUBLICATIONS

Adhesives for Flip-Chip Bonding, DELO, (8 pages) http://www.venso.se/pdf/delo/DELO_Flip_Chip.pdf.

(Continued)

*Primary Examiner* — Kristy A Haupt
(74) *Attorney, Agent, or Firm* — Gerald E. Linden

(57) ABSTRACT

An RFID chip (CM) is flip-chip mounted and connected to a surface of a substrate (MT), such as for a 6-pad ISO smart card antenna module (AM). A winding core (WC) for an antenna (MA) stiffens, stabilizes and planarizes substrate (MT) to enhance reliability of the connections. The flip-chip antenna module (FCAM) interfaces with a contactless reader. Contact pads (CP) on the opposite side of the substrate (MT) provide a contact interface. Also disclosed is first forming an antenna (MA) on an antenna substrate (AS), then joining it to the module substrate (MT). Such an antenna may be an embedded wire, or an etched metal layer.

15 Claims, 15 Drawing Sheets

Related U.S. Application Data continuation-in-part of application No. 13/594,895, filed on Aug. 27, 2012, now Pat. No. 8,789,762, and a continuation of application No. 13/744,686, filed on Jan. 18, 2013, and a continuation of application No. 13/027,415, filed on Feb. 15, 2011, now Pat. No. 8,613,132, and a continuation-in-part of application No. 13/224,351, filed on Sep. 2, 2011, and a continuation-in-part of application No. 13/205,600, filed on Aug. 8, 2011, now Pat. No. 8,474,726.

(60) Provisional application No. 61/373,269, filed on Aug. 12, 2010, provisional application No. 61/619,951, filed on Apr. 4, 2012, provisional application No. 61/589,434, filed on Jan. 23, 2012, provisional application No. 61/595,088, filed on Feb. 5, 2012, provisional application No. 61/693,262, filed on Aug. 25, 2012, provisional application No. 61/704,624, filed on Sep. 24, 2012.

(56) References Cited

U.S. PATENT DOCUMENTS

| | | | |
|---|---|---|---|
| 5,261,615 A | 11/1993 | Cuttelod | |
| 5,381,848 A | 1/1995 | Trabucco | |
| 5,393,001 A | 2/1995 | Gustafson | |
| 5,572,410 A | 11/1996 | Gustafson | |
| 5,606,488 A | 2/1997 | Gustafson | |
| 5,649,352 A | 7/1997 | Gustafson | |
| 5,773,812 A | 6/1998 | Kreft | |
| 5,955,723 A | 9/1999 | Reiner | |
| 5,988,487 A | 11/1999 | MacKay et al. | |
| 6,008,993 A | 12/1999 | Kreft | |
| 6,088,230 A | 7/2000 | Finn et al. | |
| 6,095,423 A | 8/2000 | Houdeau et al. | |
| 6,142,381 A | 11/2000 | Finn et al. | |
| 6,190,942 B1 | 2/2001 | Wilm et al. | |
| 6,233,818 B1 | 5/2001 | Finn et al. | |
| 6,293,456 B1 | 9/2001 | MacKay et al. | |
| 6,310,778 B1 | 10/2001 | Finn et al. | |
| 6,378,774 B1 | 4/2002 | Emori et al. | |
| 6,406,935 B2 | 6/2002 | Kayanakis et al. | |
| 6,424,301 B1 | 7/2002 | Johnson et al. | |
| 6,698,089 B2 | 3/2004 | Finn et al. | |
| 6,719,206 B1 | 4/2004 | Bashan et al. | |
| 6,817,534 B2 | 11/2004 | Gray | |
| 7,229,022 B2 | 6/2007 | Rietzler | |
| 7,320,738 B2 | 1/2008 | Radenne et al. | |
| 7,928,918 B2 | 4/2011 | Caruana et al. | |
| 7,980,477 B2 | 7/2011 | Finn | |
| 8,100,337 B2 | 1/2012 | Artigue et al. | |
| 8,130,166 B2 | 3/2012 | Ayala et al. | |
| 2002/0020903 A1 | 2/2002 | Kreft et al. | |
| 2008/0099559 A1 | 5/2008 | Lo et al. | |
| 2008/0179404 A1 | 7/2008 | Finn | |
| 2008/0283615 A1 | 11/2008 | Finn | |
| 2008/0308641 A1 | 12/2008 | Finn | |
| 2008/0314990 A1 | 12/2008 | Rietzler | |
| 2009/0057414 A1 | 3/2009 | Brunet et al. | |
| 2009/0315320 A1 | 12/2009 | Finn | |
| 2010/0176205 A1 | 7/2010 | Patrice | |
| 2010/0283690 A1 | 11/2010 | Artigue et al. | |
| 2011/0163167 A1 | 7/2011 | Artigue et al. | |
| 2012/0038445 A1 | 2/2012 | Finn | |

FOREIGN PATENT DOCUMENTS

| | | |
|---|---|---|
| DE | 43 11 493 | 4/2000 |
| DE | 69706577 | 9/2001 |
| DE | 102006024247 | 11/2007 |
| EP | 1031939 | 8/2000 |
| NL | 9100347 | 3/1992 |
| WO | WO 9953740 | 10/1999 |

OTHER PUBLICATIONS

International Search Report and Written Opinion dated Apr. 2, 2013.
International Search Report and Written Opinion dated Oct. 31, 2012.
FCOS™ Flip Chip on Substrate, Infineon Technologies AG, (2 pages) http://www.infineon.com/dgdl/FCOS_Flyer.pdf?folderId=db3a304412b407950112b41697ad2110&fileId=db3a304412b407950112b41697e62111.
Seashell Technology, Silver Nanowires, 2000-2013 (4 pages) http://www.seashelltech.com/nanoRods.shtml.

Dual Interface (DI) Smart Card, and Readers

AM with wire wound MA
CM and MA wire-bonded to MT using the MA as a dam to contain resin module antenna (MA) subassembly DIF Smart Card
(and Readers)

DS as WC for an AM

DS slotted to accommodate wire(s) extending inwardly wire ends of MA
extend inward of WC wire ends of MA
extend outward from WC single-flange WC for MA $h3 = h1 + h2$
$OD = ID + 2*t + 2*fw$ affix WC to MT ready for winding MA MA is wound on WC install CM in WC
wire-bonding glob-top interior of WC MM over CM and MA install AM in CB double-sided AM with openings and vias CP layout/assignments MA with one coil MA with two coils two module antenna segments (MA1, MA2)

two antenna segments (OS, IS) connected as quasi-dipole

MA serves as "dam" for glob-top

MA and CM are overmolded chip module with wire bonded IC chip module with flip chip on substrate (FCOS)

chip module with IC and etched antenna
(8 contact pads)

8-pad contact pattern 6-pad contact pattern etched antenna on separate layer antenna substrate AS joined to module substrate MT

RFID ANTENNA MODULES AND METHODS

CROSS-REFERENCE(S) TO RELATED APPLICATIONS

This is a nonprovisional filing of U.S. 61/595,088 filed 5 Feb. 2012

This is a nonprovisional filing of U.S. 61/693,262 filed 25 Aug. 2012

This is a nonprovisional filing of U.S. 61/704,624 filed 24 Sep. 2012

This is a continuation-in-part of U.S. Ser. No. 13/310,718 filed 3 Dec. 2011

This is a continuation-in-part of Ser. No. 13/594,895 filed 27 Aug. 2012

This is a continuation-in-part of Ser. No. 13/744,686 filed 18 Jan. 2013 which claims priority from 61/619,951 filed 4 Apr. 2012
61/589,434 filed 23 Jan. 2012

This is a continuation-in-part of Ser. No. 13/027,415 filed 15 Feb. 2011

This is a continuation-in-part of Ser. No. 13/224,351 filed 2 Sep. 2011

This is a continuation-in-part of Ser. No. 13/205,600 filed 8 Aug. 2011 which claims priority from 61/373,269 filed 12 Aug. 2010

TECHNICAL FIELD

The invention relates to "secure documents" such as electronic passports, electronic ID cards and smart cards (data carriers) having RFID (radio frequency identification) chips or chip modules (CM) and operating in a "contactless" mode (ISO 14443) including dual interface (DI, or DIF) cards which can also operate in contact mode (ISO 7816-2), and more particularly to improving coupling between components within the smart card, such as between a module antenna (MA) connected with the RFID chip (CM) and a booster antenna (BA) in the card body (CB) of the smart card and inductively coupled with the module antenna (MA) and consequent improvements in the RFID chip (CM) interacting with external RFID readers.

BACKGROUND

For purposes of this discussion, an RFID transponder generally comprises a substrate, an RFID chip or chip module (CM) disposed on or in the substrate, and an antenna disposed on or in the substrate. The transponder may form the basis of a secure document such as an electronic passport, smart card or national ID card, which may also be referred to as "data carriers". The chip (CM) may be also referred to as an integrated circuit (IC).

The RFID chip (CM) may operate solely in a contactless (non-contact) mode (such as ISO 14443), or may be a dual interface (DI, DIF) chip module (CM) which may additionally be operative to function in a contact mode (such as ISO 7816-2) and a contactless mode. The RFID chip (CM) may harvest energy from an RF signal supplied by an external RFID reader device with which it communicates. The chip module (CM) may be a leadframe-type chip module or an epoxy-glass type chip module. The epoxy-glass module can be metallized on one side (contact side) or on both sides with through-hole plating to facilitate the interconnection with the antenna.

The substrate, which may be referred to as an "inlay substrate" (such as for electronic passport) or "card body" (such as for smart card) may comprise one or more layers of material such as Polyvinyl Chloride (PVC), Polycarbonate (PC), polyethylene (PE), PET (doped PE), PET-G (derivative of PE), Teslin™, Paper or Cotton/Noil, and the like.

An antenna, which may be referred to as a "card antenna" (CA), may be mounted to the inlay substrate using a sonotrode (ultrasonic tool) and electrically connected with the chip module (CM). See, for example U.S. Pat. No. 6,698,089 and U.S. Pat. No. 6,233,818, incorporated by reference herein. A typical pattern for a card antenna (CA) is generally rectangular, in the form of a flat (planar) coil (spiral) having a number of turns, disposed around the periphery of the substrate (or relevant portion thereof). See, for example, U.S. Pat. No. 7,980,477 (2011, Finn).

Rather than directly electrically connecting the RFID chip (CM) to a card antenna (CA), a module antenna (MA) may be incorporated into an antenna module (AM) comprising the RFID chip (CM) and the module antenna (MA). The module antenna (MA) may be quite small (such as approximately 15 mm×15 mm), in contrast with the card antenna (CA) (such as approximately 50 mm×80 mm). The module antenna (MA) may be inductively coupled rather than electrically connected to the card antenna (CA). In such cases, the card antenna (CA) may be referred to as a booster antenna (BA). The booster antenna (BA) may comprise a portion disposed around the periphery of the card body (CB), and another portion which may comprise a coupler coil (CC) disposed at an interior area of the card body (CB) for inductively coupling with the module antenna (MA). The terms card antenna (CA) and booster antenna (BA) may be used interchangeably herein.

US 20120038445 (2012, Finn) discloses a transponder with an antenna module (AM) having a chip module (CM) and an antenna (MA); a booster antenna (BA) having outer and inner antenna structures (D,E) in the form of flat coils disposed around the periphery of the card body (CB). The antenna module (AM) may be positioned so that its antenna (MA) overlaps only one of the antenna structures or the second antenna structure, for inductive coupling thereto.

U.S. Pat. No. 5,084,699 (1992, Trovan) entitled Impedance Matching Coil Assembly For An Inductively Coupled Transponder. Attention is directed to FIG. 5. A coil assembly for use in an inductively powered transponder includes a primary coil (156) and a secondary coil (158) wrapped around the same coil forming ferrite rod (160). The primary coil's leads (162) are left floating while the secondary coil's leads (164) are connected to the integrated identification circuit of the transponder.

U.S. Pat. No. 5,955,723 (1999, Siemens) entitled Contactless Chip Card discloses a data carrier configuration includes a semiconductor chip. Attention is directed to FIG. 1. A first conductor loop (2) is connected to the semiconductor chip (1) and has at least one winding and a cross-sectional area with approximately the dimensions of the semiconductor chip. At least one second conductor loop (3) has at least one winding, a cross-sectional area with approximately the dimensions of the data carrier configuration and a region forming a third loop (4) with approximately the dimensions of the first conductor loop (2). The third loop (4) inductively couples the first conductor loop (2) and the at least one second conductor loop (3) to one another.

U.S. Pat. No. 6,378,774 (2002, Toppan) discloses a smart card comprising an IC module and an antenna for non-contact transmission. The IC module has both a contact-type function and a non-contact-type function. The IC module has a first coupler coil (8), the antenna has a second coupler coil (3). The first and second coupler coils are disposed to be closely coupled to each other, and are coupled in a non-contact state by transformer coupling. Various ways of forming the first coupler coil (8) are shown. For example, in FIG. 14, the first coupler coil (8) is wound around a coil frame (17), which is provided around the seal resin (16) of IC chip (6).

U.S. Pat. No. 7,928,918 (2011, Gemalto) entitled Adjusting Resonance Frequency By Adjusting Distributed Inter-Turn Capacity discloses a method for adjusting frequency tuning of a resonant circuit with turns having a regular spacing generating stray inter-turn capacity.

U.S. Pat. No. 8,130,166 (2012, Assa Abloy) discloses Coupling Device For Transponder And Smart Card With Such Device. Attention is directed to FIG. 6. A coupling device is formed by a continuous conductive path having a central section (12) and two extremity sections (11, 11'), the central section (12) forming at least a small spiral for inductive coupling with the transponder device, the extremities sections (11, 11') forming each one large spiral for inductive coupling with the reader device.

US2010/0176205 (2010, SPS) entitled Chip Card With Dual Communication Interface. Attention is directed to FIG. 4. A card body (22) includes a device (18) for concentrating and/or amplifying electromagnetic waves, which can channel the electromagnetic flow received, in particular, from a contactless chip card reader toward the coils of the antenna (13) of the microelectronic module (11). The device (18) for concentrating and/or amplifying electromagnetic waves may consist of a metal sheet disposed in the card body (22) below the cavity (23) receiving the microelectronic module (11), or may consist of an antenna consisting of at least one coil, disposed in the card body (22) below the cavity (23) receiving the microelectronic module (11).

The following patents and publications are referenced, and may be "incorporated by reference", herein: CA 2,279,176 (1998, PAV); DE 39 35 364 (1990, ADE); DE 43 11 493 (2000, Amatech); NL 9100347 (1992, 'Nedap'); U.S. Pat. No. 5,773,812 (1998, ADE); U.S. Pat. No. 6,008,993 (1999, ADE); U.S. Pat. No. 6,142,381 (2000, Finn et al.); U.S. Pat. No. 6,190,942 (2001, "PAV"); U.S. Pat. No. 6,095,423 (2000, Siemens); U.S. Pat. No. 6,310,778 (2001, Finn et al.); U.S. Pat. No. 6,406,935 (2002, ASK); U.S. Pat. No. 6,719,206 (2004, On Track); U.S. Pat. No. 7,320,738 (2008, FCI); U.S. Pat. No. 8,100,337 (2012, "SPS"); US 2008/0283615 (2008, Finn); US 2008/0308641 (2008, Finn); US 2008/0314990 (2008, Smartrac); US 20090057414; US 2002/0020903 (2002, ADE); US 20100283690 (2010, SPS); US 2011/0163167 (2011, SPS).

SUMMARY

It is an object of the invention to provide improved techniques for manufacturing antenna modules (AM) for secure documents such as smart cards (SC).

A winding core (WC) having a tubular body portion (B) and two ends is mounted by one of its ends to a module tape (MT), a module antenna (MA) is wound around the winding core (WC), a chip (CM) is disposed on the module tape (MT) within the winding core (WC). Connections (wb) are made, and glob-top (GT) is applied over the chip (CM), substantially filling the interior area of the winding core (WC). The module antenna (MA), winding core (WC) and chip (CM) may subsequently be overmolded with a mold mass (MM). The winding core (WC) may have a flange (F) at one end.

According to an embodiment of the invention, an antenna module (AM) for a smart card (SC) may comprise: a module tape (MT); a chip (CM) disposed on a surface of the module tape (MT); and a module antenna (MA) disposed on the surface of the module tape (MT), and connected with the chip (CM); characterized by: a support structure (DS, WC) secured to the surface of the module tape (MT), serving as a winding core for the module antenna (MA) and as a dam for glob-top (GT) covering the chip (CM); wherein the support structure (DS, WC) comprises a tubular body portion (B) having two opposite open ends, one of which is secured to the surface of the module tape (MT), the other of which is a free end. The support structure (WC) may have a flange (F) disposed around the free end of the body portion (B). The module antenna (MA) may be disposed external to the body portion (B); and the chip (CM) may be disposed on the module tape (MT) internal to the body portion (B). At least one slot (S) may extending through the body portion (B) to allow corresponding at least one end of the module antenna (MA) to pass through the body portion (B) from external the body portion (B) to internal the body portion (B). Glob-top may cover at least the chip (CM), within the support structure. A mold mass (MM) may cover the chip (CM) the support structure (DS, WC) and the module antenna (MA). Contact pads (CP) may be disposed on an opposite surface of the module tape (MT) for a contact interface.

A smart card (SC) may comprise the antenna module (AM) disposed in a card body (CB) having a booster antenna (BA) having an outer portion disposed around a periphery of the card body (CB) and a coupler coil (CC) disposed at an interior area of the card body (CB); wherein the antenna module (AM) is disposed at the interior area of the card body (CB) for inductive coupling of the module antenna (MA) with the coupler coil (CC). A recess (R) may be provided in the card body (CB) for receiving the antenna module (AM). At least a portion of the coupler coil (CC) may be embedded in the recess (R).

According to an embodiment of the invention, a method of making an antenna module (AM) may comprise: affixing a tubular support structure (DS, WC) having two opposite open ends on a surface of a module tape (MT); and winding a wire for a module antenna (MA) around the tubular support structure (DS, WC). The module antenna (MA) may be wound using a flyer winding technique. Before winding the wire around the support structure, a first end of the wire for forming the module antenna (MA) may be secured to a first pin; and a first end portion of the wire may be passed over a first bond pad (BP) on the module tape (MT). After winding the wire around the support structure, a second end portion of the wire may be passed over a second bond pad (BP) on the module tape (MT); and a second end of the wire for forming the module antenna (MA) may be secured to a second pin. The first and second end portions may be connected to the first and second bond pads.

According to an embodiment of the invention, a method of making an antenna module (AM) may comprise: mounting a module antenna (MA) to a module tape (MT); mounting and connecting a chip (CM) to the module tape (MT); covering the chip (CM) and its connections with resin (GT); characterized by: the chip (CM) and its connections are covered with resin (GT) by filling an interior area of the module antenna (MA) with resin after mounting the module antenna (MA) and after mounting and connecting the chip (CM).

A smart card (SC) may comprise a card body (CB) and an antenna module (AM). The card body (CB) may have a booster antenna (BA) comprising windings disposed around the periphery of the card body (CB) and a coupler coil (CC) disposed at an interior area of the card body (CB). An antenna module (AM) having a module antenna (MA), may be disposed in a recess of the card body (CB), within the interior of the coupler coil (CC), and may be substantially coplanar with the coupler coil (CC), so that the module antenna (MA) couples inductively (transformer coupling) with the coupler coil (CC).

According to an embodiment of the invention, an antenna module (AM) for a smart card (SC) may comprise: a substrate (MT, 202, 402); a chip (CM, 1010) disposed on a surface of the substrate (MT) and flip-chip connected (FIGS. 9, 10) to pads (1022) on the surface of the substrate (MT); and an antenna (MA, 230, 430) disposed on the surface of the substrate (MT), and connected with the chip (CM); characterized by: a support structure (DS, WC, 220, 420) secured to the surface of the substrate (MT), serving as a winding core for the antenna (MA); wherein the support structure (DS, WC, 220, 420) comprises a tubular body portion (B) having two opposite open ends (220a/b, 420a/b), one of which is secured to the surface of the substrate (MT), the other of which is a free end.

According to an embodiment of the invention, a method of making an antenna module (AM) may comprise: flip chip mounting and bonding a chip (CM) to a substrate (MT); characterized by: affixing a tubular support structure (DS, WC, 220, 420) having two opposite open ends (220a/b, 410a/b) on a surface of the substrate (MT, 202, 402); and winding a wire for an antenna (MA) around the tubular support structure (DS, WC). Prior to mounting and bonding the chip (CM) to the substrate (MT), a conductive material (1014, 1024) may be applied to at least one of bumps (1012) on the chip (CM, 1010) and pads (1022) on the substrate (1020). The conductive material may comprise silver nanowires.

According to an embodiment of the invention, an antenna module (AM) for a smart card (SC) may comprise: a module substrate (MT); and a chip (CM) disposed on a surface of the module substrate (MT); characterized by: an antenna (MA) disposed on an antenna substrate (AS) which is separate from the module substrate (MT); an opening (OP) in the antenna substrate (AS) for accommodating the chip (CM) when the antenna substrate (AS) is joined to the module substrate (MT). The chip (CM) may be flip-chip mounted and connected to module substrate (MT). The antenna (MA) may comprise wire embedded in the antenna substrate (AS), or may be etched from a metal layer on the antenna substrate (AS), such as by laser etching (ablation).

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams. Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein.

DETAILED DESCRIPTION

Various embodiments will be described to illustrate teachings of the invention(s), and should be construed as illustrative rather than limiting. Any dimensions and materials or processes set forth herein should be considered to be approximate and exemplary, unless otherwise indicated.

In the main hereinafter, transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports. As used herein, any one of the terms "transponder", "smart card", "data carrier", and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 7816 is an international standard related to electronic identification cards with contacts, especially smart cards.

A typical data carrier described herein may comprise (i) an antenna module (AM) having an RFID chip or chip module (CM) and a module antenna (MA), (ii) a card body (CB) and (iii) a booster antenna (BA) disposed on the card body (CB) to enhance coupling between the module antenna (MA) and the antenna of an external RFID "reader". When "chip module" is referred to herein, it should be taken to include "chip", and vice versa, unless explicitly otherwise stated. The module antenna (MA) may comprise a coil of wire, conductive traces etched or printed on a module tape (MT) substrate for the antenna module (AM), or may be incorporated directly on the chip itself.

Figure 8A:
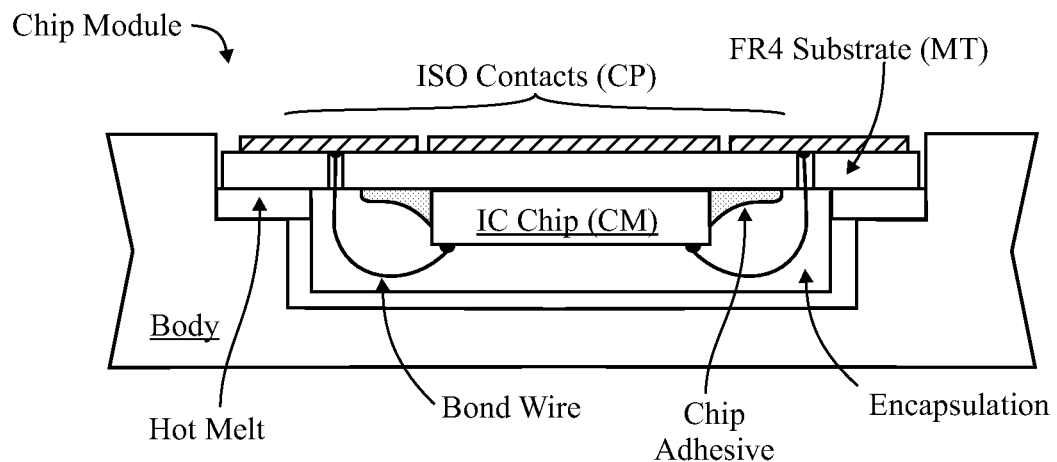
FIG. 8A is a side view diagram of a chip module with wire-bonded IC.
Figure 8B:
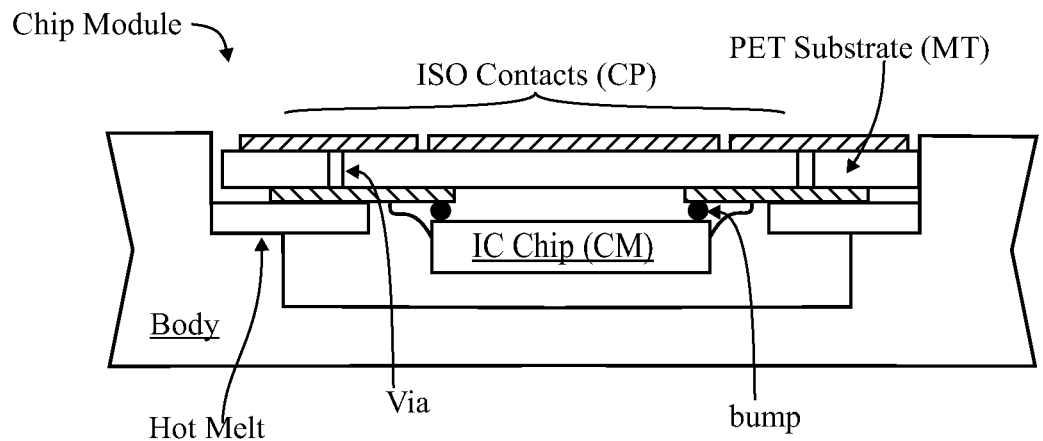
FIG. 8B is a side view diagram of a chip module with flip chip on substrate.

Throughout the various embodiment disclosed herein, unless specifically noted otherwise (in other words, unless excluded), the element referred to as "CM" will be most appropriately be a bare integrated circuit (IC) die (or RFID chip), rather than a chip module (a die with a carrier). In contrast therewith, FIGS. 8A and 8B present examples that are specifically "chip modules" having IC chips (such as a "CM") mounted and connected to substrates. A "chip module" (die and carrier) with a module antenna (MA) mounted and connected thereto may be referred to as an antenna module (AM).

The booster antenna (BA) may be formed by embedding wire in an inlay substrate or card body (CB). However, it should be understood that the antenna may be formed using a processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Generally, coupling between the module antenna (MA) and the antenna of an external RFID reader may be enhanced by incorporating a booster antenna (BA) on the card body (CB). In some respects, a booster antenna (BA) is similar to a card antenna (CA). However, in contrast with a card antenna (CA) which is directly electrically connected with the RFID chip or chip module (such as in U.S. Pat. No. 7,980,477), the booster antenna (BA) is inductively coupled with the module antenna (MA) which may be connected with the RFID chip (CM). Such inductive coupling may be more difficult to accomplish than a direct electrical connection.

As used herein, the term "coupling" (and variants thereof) refers to inductive, magnetic, capacitive or reactive coupling (including combinations thereof, any of which may be referred to as "inductive coupling") between two elements relying on the generation of an electromagnetic field by a given element and the reaction to (interaction with) the field(s) by another element. In contrast thereto, the term "connecting" (and variants thereof) refers to two elements being electrically connected with one another wherein the interaction between the two elements results from the flow of electrons between the two elements. Typically, two elements which are inductively coupled with one another are not electrically connected with one another. Elements which are coils of wire such as a module antenna MA and a coupler coil CC disposed near each other are generally inductively coupled with one another, without any electrical connection between the two elements. In contrast thereto, the module antenna MA is generally electrically connected with the RFID chip (CM) element. The windings and coils of the booster antenna BA, such as outer winding OW, inner winding IW and coupler coil CC elements, are generally electrically connected with one another, but may also exhibit inductive coupling with one another. The module antenna MA and coupler coil CC are not electrically connected with one another, but are inductively coupled (or "transformer coupled") with one another.

The booster antenna BA (and other features) disclosed herein may increase the effective operative ("reading") distance between the antenna module AM and an external contactless reader with capacitive and inductive coupling. With reading distances typically on the order of only a few centimeters, an increase of 1 cm can represent a significant improvement.

Dual Interface (DI) Smart Card and Readers

Figure 1:
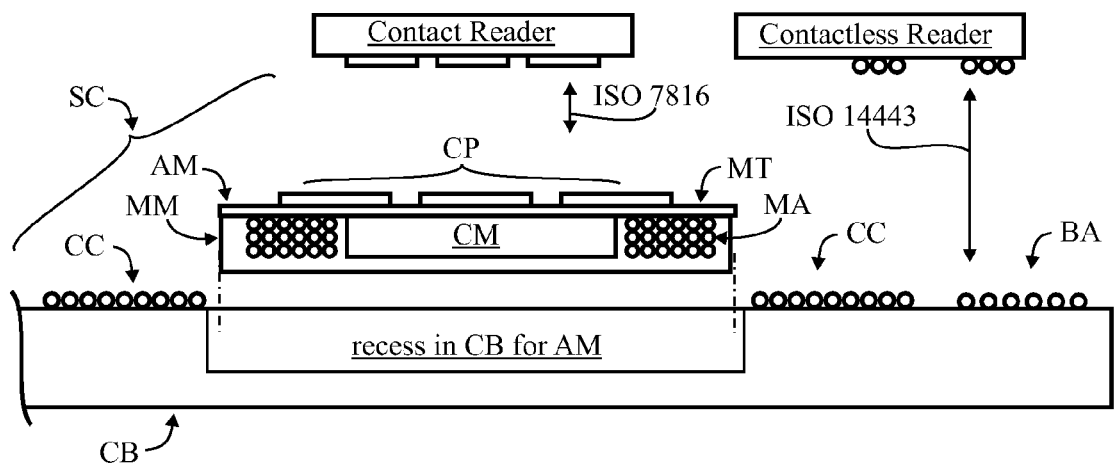
FIG. 1 is a cross-sectional view of a portion of a dual interface (DI) smart card (SC), showing antenna module (AM) with module antenna (MA), and external "contact" and "contactless" reader devices.

FIG. 1 illustrates a dual interface (DI) smart card SC comprising:
  an RFID chip (or chip module) CM, which may be a dual interface (DI) chip or chip module, disposed on an underside of a substrate or module tape MT (or chip carrier tape, or metal leadframe);
  a number (such as six) of contact pads CP for implementing a contact interface (ISO 7816) on a top side of the module tape MT; and
  a module antenna MA disposed on the underside of the module tape MT, typically formed from an etched conductor or wire, in a spiral (coil) pattern.
  The module tape MT supports and effects interconnections between the RFID chip CM, contact pads CP and module antenna MA, and may be single-sided, having metallization on only one side, or double-sided, having metallization on both sides.
  The RFID chip CM may be connected in any suitable manner, such as flip-chip connected or wire bonded to the module tape MT.
  The RFID chip CM and module antenna MA may be overmolded by a mold mass MM, for protecting the CM and MA components, and interconnections.
  As used herein, "chip module" includes one or more bare semiconductor dice (chips), including integrated circuit (IC) chips. A "hybrid" chip module may comprise a chip for contact interface and a chip for contactless interface, or the like. Reference is made to U.S. Pat. No. 6,378,774 (2002, Toppan) for an example of a DIF chip solution, and to US 2010/0176205 (2010, SPS) for an example of a two chip solution wherein one chip performs the contact function and the other chip performs the contactless function.

A ferrite element (film or layer) may be incorporated into the antenna module AM, between the contact pads CP and the module antenna MA to reduce attenuating effects which may be caused by the conductive contact pads CP.

Together, the RFID chip CM, chip tape MT, contact pads CP and module antenna MA constitute an "antenna module" AM.

The smart card SC further comprises:

a substrate which for smart cards may be referred to as a "card body" CB. (For an electronic passport, the substrate would be an "inlay substrate".)

a booster antenna BA (or card antenna CA) is shown disposed around (just within) the periphery of the card body CB, typically in the form of a rectangular, planar spiral having a number of turns.

As used herein, the term card body CB is intended to embrace any substrate supporting the booster antenna BA and receiving the antenna module AM. A recess may be provided in the card body CB for receiving the antenna module AM.

The smart card may be referred to as a "data carrier", or "transponder", or the like.

Some exemplary and/or approximate dimensions, materials and specifications may be:

Module Tape (MT): epoxy-based tape, 60 μm thick

Chip Module (CM): NXP SmartMx or Infineon SLE66, or other

Antenna Module (AM): 15 mm×15 mm and 300 μm thick

Module Antenna (MA): several windings of approximately 50 μm copper wire, surrounding the chip module CM.

Card Body CB: approximately 54 mm×86 mm, 810 μm thick, polycarbonate (PC). The card body and its card antenna (CA, or booster antenna BA) are significantly (such as 20 times) larger than the chip module CM and its module antenna MA.

Booster Antenna BA: 3-12 turns of 112 μm copper, self-bonding wire, ultrasonically embedded in the card body CB. Alternatively, the booster antenna BA may comprise insulated 80 μm copper wire, disposed in a spiral pattern approximately 46 mm×76 mm (slightly smaller than the card body CB), pitch of the turns 300 μm, exhibiting a resonant frequency of 13.56 MHz. The optimized self-resonance frequency of the booster antenna BA may be approximately 13~17 MHz.

An example of a booster antenna with external sections forming a large spiral (11, 11') and a central portion forming a small spiral (12) may be found in U.S. Pat. No. 8,130,166 (2012, "Assa Abloy"), incorporated by reference herein. The large spiral is comparable (or analogous) to the BA in FIG. 1, the small spiral is comparable to the CC in FIG. 1.

An example of a booster antenna with an antenna coil (4) and a coupler coil (3) may be found in U.S. Pat. No. 6,378,774 (2002, "Toppan") incorporated by reference herein. The antenna coil is comparable (or analogous) to the BA in FIG. 1, the coupler coil is comparable to the CC in FIG. 1.

The present invention is not limited to the use of any specific booster antenna, rather it is directed to particulars of the antenna module AM and its manufacture.

To enhance coupling between the module antenna MA and the booster antenna BA, a material exhibiting electromagnetic coupling properties, such as ferrite, may be disposed as a thin film on surface of the card body CB or may be incorporated or embedded as particles in the card body, or both (film and particles), in any desired pattern. The use of ferrite as a material to enhance coupling or to shield (prevent) coupling is discussed herein as exemplary of a material exhibiting high electromagnetic permeability, often being used in one form or another in conjunction with antennas. See, for example, U.S. Pat. No. 5,084,699 (1992, "Trovan").

Additional layers (not shown), such as cover layers, may be laminated to the card body CB to complete the construction of the smart card.

The antenna module (AM) may be disposed in the card body (CB), such as in a milled recess so that its module antenna MA overlaps, or is within, is substantially coplanar with or on another level from the coupler coil CC. See, for example, U.S. Pat. No. 6,378,774 (2002, Toppan), incorporated in its entirety by reference herein.

FIG. 1 further illustrates a contact reader having contacts for interacting (providing power and exchanging data) with the chip module CM via the contact pads CP in a contact mode (ISO 7816), and a contactless reader having an antenna for interacting with the chip module CM via the booster antenna BA and the module antenna MA (alternatively via a card antenna CA) in a contactless mode (ISO 14443).

An Embodiment of an Antenna Module (AM)

Figure 1A:
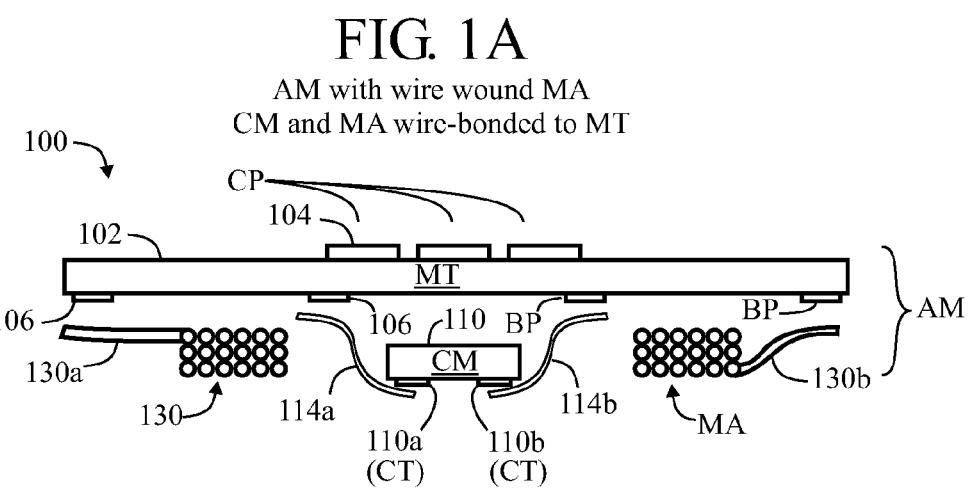
FIGS. 1A, 1B, 1C are cross-sectional view of some antenna modules (AMs).

FIG. 1A shows an antenna module (AM) 100 having an RFID chip (CM) 110 and a wound wire module antenna (MA) 130, both of which may be wire bonded to bond pads (BP) 106 on a lower surface of a module tape (MT) 102. More particularly, an epoxy glass substrate (MT) 102 having a number of contact pads (CP) 104 on its top (as viewed) surface for making a contact interface with an external reader in a "contact mode" of operation, and a number of bond pads (BP) 106 disposed on an opposite surface of the module tape (MT) 102;

The chip (CM) 110 may be mounted to the underside (as viewed) of the module tape (MT) 102 with its terminals (CT) 110a, 110b connected such as by conventional wire bonding to selected ones of the bond pads (BP) 106 on the underside (as viewed) of the module tape (MT) 102. Only two of the wire bond connections 114a and 114b are shown, for illustrative clarity.

a module antenna (MA) 130 comprising (for example) several turns of wire, such as in a 3×6 configuration (3 layers, each layer having 6 turns), and having two ends 130a and 130b. The module antenna 130 may be connected by its ends 130a, 130b such as be thermo compression bonding to two of the bond pads (BP) 106 on the underside of the module tape (MT) 102, as illustrated.

To protect the wire bonds (connections) between the chip terminals CT and the bond pads BP, after mounting the module antenna MA to the module tape MT, and after mounting and connecting the chip CM to the module tape MT (either before or after mounting the module antenna MA), the interior area of the module antenna MA may be filled with resin GT, the module antenna MA acting as a "dam" to contain the resin GT. See FIG. 1B The module antenna MA and its ends, as well as the chip CM and its connections (which may already be covered with resin GT) may be overmolded with a mold mass (MM).

The aggregate of the elements described above, generally the module tape (MT) 102, chip module (CM) 110 and module antenna (MA) 130 may be referred to as an "antenna module" (AM) 100.

In FIG. 1A, the module tape MT may be referred to as "double sided" because it has conductive elements formed in metallic layers (metallization) on both the top and bottom surfaces thereof (contact pads CP on the top surface, bond pads BPs on the bottom surface. Conductive elements, such as vias, internal to the module tape MT are omitted, for illustrative clarity. The module tape may alternatively be "single sided" having metallization on only side thereof, such as only on the top (face-up) side, for the contact pads CP. For a single sided tape, openings may extend through the module tape MT for making connections from the chip CM and/or module antenna MA disposed on the underside of the module tape MT to the back surfaces of selected ones of the contact pads CP on the top surface of the module tape MT.

Figure 1B:
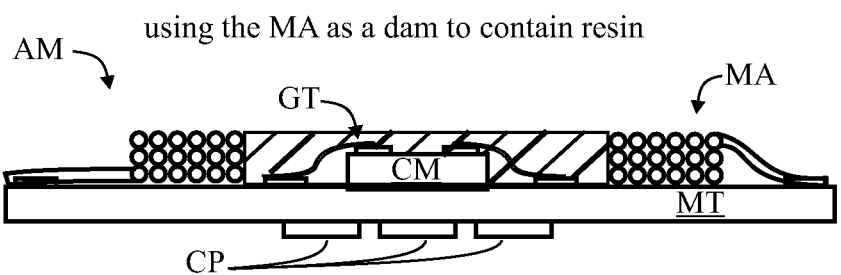
Figure 1C:
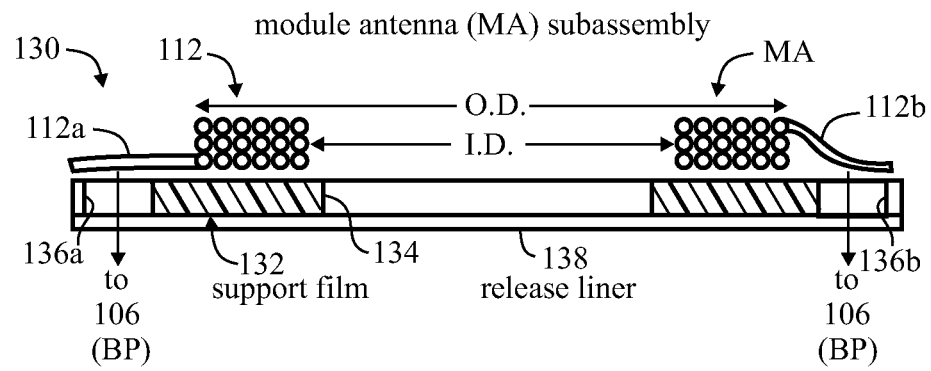

FIG. 1C illustrates a module antenna (MA), or coil subassembly 130, that can be used in antenna modules disclosed herein, such as (but not limited to) the antenna module of FIG. 1A. A coil of wire 112 for the module antenna (MA) may be wound, using any suitable coil-winding tool, and disposed on a film support layer 132. The module antenna MA may comprise several turns of wire, and may be in the form of a ring (cylinder), having an inner diameter (ID) of approximately 9 mm, and an outer diameter (OD) of approximately 10 mm.

The film support layer 132 may be nitrile film, 60 μm thick and have overall outer dimensions of approximately 10-15 mm×10-15 mm, or approximately twice as large (across, in one dimension) as the module antenna MA which will be mounted thereto. A central opening 134 may be provided through the film 132, generally aligned with the position of the module antenna MA, and having a diameter which is nearly as large as the ID of the module antenna MA. The opening 134 may be formed by a punching operation. The opening 134 is for accommodating a chip CM (such as 110, FIG. 1A) and its wire bonds when the antenna module AM is assembled.

Two openings 136a and 136b may be provided (in the same punching operation as the central opening 134) through the film 132 for accommodating bonding of the antenna wire ends 112a and 112b, respectively, to the bond pads BP (106, FIG. 1A) on the module tape MT (102).

A release liner 138 may be provided on one side of the film 132, such as the side opposite the module antenna MA. The central opening 134 may or may not extend through the release liner 138, which may be paper, having a thickness of approximately 60 μm.

After being mounted to the module tape MT (102), and after the chip CM (110) is mounted and connected, the module antenna MA 112 may be filled with resin to protect the chip CM and its connections. The module antenna MA may be connected before connecting the chip CM so as to avoid damaging the chip CM connections.

Figure 1D:
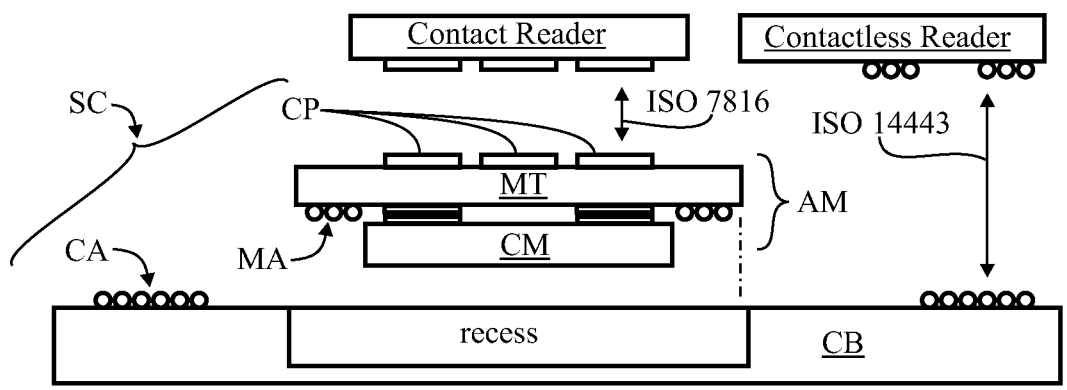
FIG. 1D is a diagram showing a smart card (SC) with an antenna module (AM) having a chip (CM) that is flip chip mounted to the module tape (MT).

FIG. 1D illustrates a DIF smart card comprising:
a dual interface (DIF) RFID chip CM disposed on an underside of a substrate or module tape MT;
a number (such as six) of contact pads CP for implementing a contact interface (ISO 7816) on a top side of the module tape MT; and
a module antenna (MA) disposed on the underside of the module tape (MT), typically formed from an etched conductor or wire, in a spiral (coil) pattern.

The substrate MT supports and effects interconnections between the chip CM, contact pads CP and module antenna MA, and may be single-sided, having metallization on only one side, or double-sided, having metallization on both sides.

The chip CM may be connected in any suitable manner, such as flip-chip connected (as illustrated in FIG. 1D) or wire bonded (as illustrated in FIG. 1A to the module tape MT).

As may be used herein, "chip module" includes one or more bare semiconductor dice (chips). A "hybrid" chip module may comprise a chip for contact interface and a chip for contactless interface, or the like. Reference is made to U.S. Pat. No. 6,378,774 (Toppan, 2002) for an example of a DIF chip solution, and to US 2010/0176205 (SPS, 2010) for an example of a two chip solution wherein one chip performs the contact function and the other chip performs the contactless function.

Together, the chip module, CM, chip tape MT, contact pads CP and module antenna MA constitute an "antenna module" AM.

The smart card further comprises:
a substrate which for smart cards may be referred to as a "card body" CB. (For an electronic passport, the substrate would be an "inlay substrate".)
a card antenna (CA), sometimes referred to as booster antenna (BA), disposed around the periphery of the card body, typically in the form of a rectangular, planar spiral having a number of turns. (A booster antenna BA may also have a coupler coil at an interior portion of the card body CB, such as surrounding the recess for the antenna module AM, see FIG. 1.)

As used herein, card body CB is intended to embrace any substrate supporting card antenna CA and receiving the antenna module AM. A recess may be provided in the card body for receiving the antenna module AM.

Some exemplary and/or approximate dimensions, materials and specifications may be:
Module Tape (MT): epoxy-based tape (or Kapton), 75 μm-110 μm thick
Chip Module (CM): NXP SmartMx or Infineon SLE66, or other
Antenna Module (AM): 13 mm×11.8 mm and 195 μm thick
Module Antenna (MA): several windings of 50 μm or 80 μm copper wire, approximately the size of the chip module CM (and not greater in size than the AM)
Card body CB: 85.6 mm×53.97 mm, 760 μm thick, polycarbonate (PC). The card body and its card antenna are significantly (such as 30 times) larger than the chip module CM and its module antenna MA.
Card Antenna CA: 7 turns of 112 μm copper, self-bonding wire, ultrasonically embedded in the card body CB.

Additional layers (not shown), such as cover layers, may be laminated to the card body to complete the construction of the smart card.

FIG. 1D further illustrates a contact reader having contacts for interacting (providing power and exchanging data) with the RFID chip CM via the contact pads CP in a contact mode (ISO 7816), and a contactless reader having an antenna for interacting with the chip module CM via the card antenna CA and the module antenna MA.

Winding the Module Antenna on a Dam Structure

Figure 2:
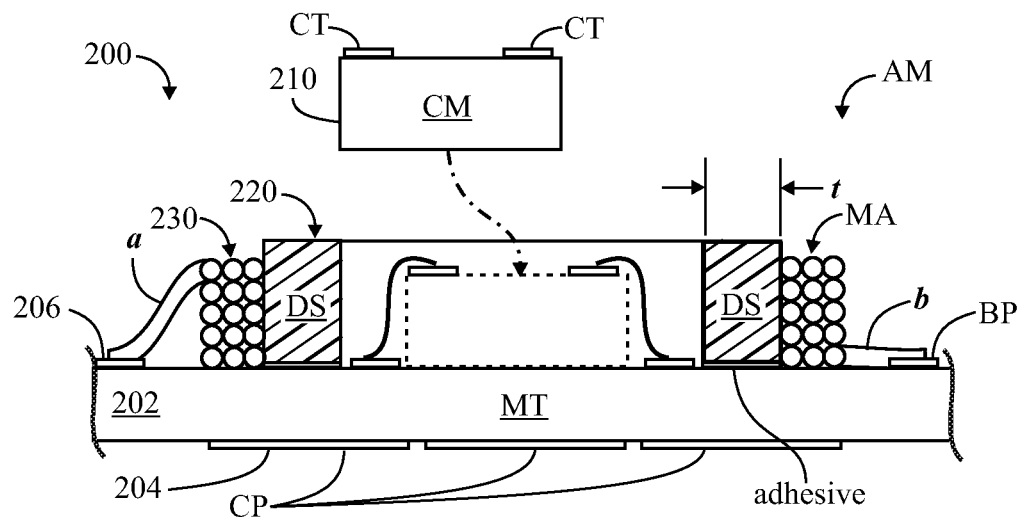
FIG. 2 is a cross-sectional view of an antenna module (AM) having a module antenna (MA) disposed on a dam structure (DS)

FIG. 2 shows that a dam structure (or simply "dam") DS 220 may be disposed on the underside (top, as viewed) of the module tape MT 202, and affixed thereto (such as with an adhesive). (The module tape MT 202 is illustrated inverted in contrast with FIGS. 1, 1A, 1D, the contact pads CP 204 being on the bottom, as viewed, in this figure.)

The dam DS 230, which may be referred to as a "winding core WC" or a "support structure" or simply as a "ring", has an elongate tubular body portion B and two opposite open ends 230a and 230b, and may be cylindrical (as illustrated) or substantially rectangular in cross-section (or any other suitable shape). One end 230b of the body portion B is mounted to the module tape MT, using a suitable adhesive, the other end 230a is a free end (un-mounted). The dam DS may be formed of a plastic material such as Mylar, having a thickness 't' of approximately 200 μm. The inner diameter (ID) of the dam DS may be approximately 7 mm, the outer diameter (OD) of the dam DS may be approximately 8 mm.

Although shown as round (cylindrical), the cross-section of the dam DS may be substantially rectangular, or other suitable shape (for winding an module antenna MA thereupon), in which case "ID" would be inner dimension, and "OD" would be outer dimension of the body portion B.

A module antenna MA 230 (compare 130) having several layers and turns of self-bonding wire may be wound on the dam DS. The dam DS should have a height 'h' which is at least as high as the resulting module antenna MA, such as approximately 350 μm. The dam DS may be impregnated with ferrite to increase the inductance of the module antenna MA. A fixture (not shown) may be used to support the DS during winding the module antenna MA. The resulting interim product comprising a module antenna MA and dam DS mounted to a module tape MT, may be considered to be a subassembly for an antenna module AM. The two ends a, b (compare 112a, 112b) of the module antenna MA are shown, extending outwardly, to bond pads BP 206 (compare 106) on the surface of the module tape MT.

An RFID chip CM 210 (compare 110) may be subsequently be mounted to surface of the module tape MT, within the interior of the dam DS and wire-bonded from its terminals CT to bond pads BP on the underside (top, as viewed in FIG. 2) of the module tape MT. Then, glob-top potting compound GT (not shown) may be applied within the interior of the dam DS to protect the chip CM and wire bonds, resulting in a substantially complete antenna module AM 200. The RFID chip CM and module antenna MA may be overmolded by a mold mass MM (not shown, see FIG. 1), for protecting the chip CM and module MA components, and respective interconnections to bond pads BP on the module tape MT, completing the antenna module AM.

Figure 2A:
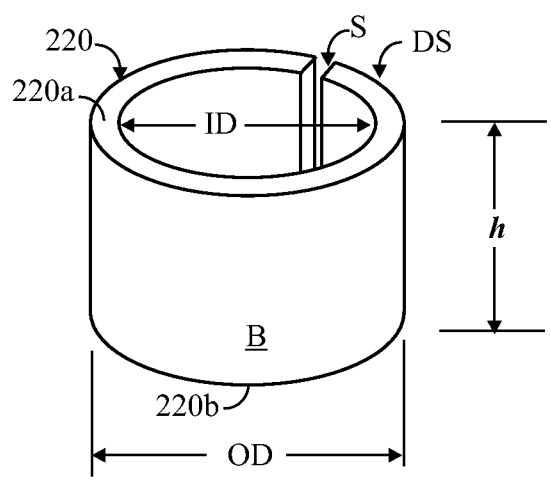
FIG. 2A is a perspective view of the dam structure (DS).

FIG. 2A shows that at least one slot S 232 may be provided through the body portion B of the dam DS (winding core WC) to accommodate corresponding at least one end (a, b) of the module antenna MA wire (not shown) passing therethrough, inwardly, from external to the body portion B to the "interior" space enclosed by the dam DS. One or both ends (a, b) of the module antenna MA may extend inwardly, through one or two slots in the body portion B (two ends can extend through a single slot, at different levels) so that the ends (a, b) terminate in an area on the module tape MT enclosed by the dam DS. The slot(s) S should be sized to (wide enough) accommodate the diameter of the antenna wire passing therethrough. Having the ends of the antenna wire terminate interior to the dam DS has the advantage that they can be protected by the same glob-top GT that protects the chip CM (see FIG. 4E).

Antenna Modules Formed on 35 Mm Chip Carrier Tape

Figure 2B:
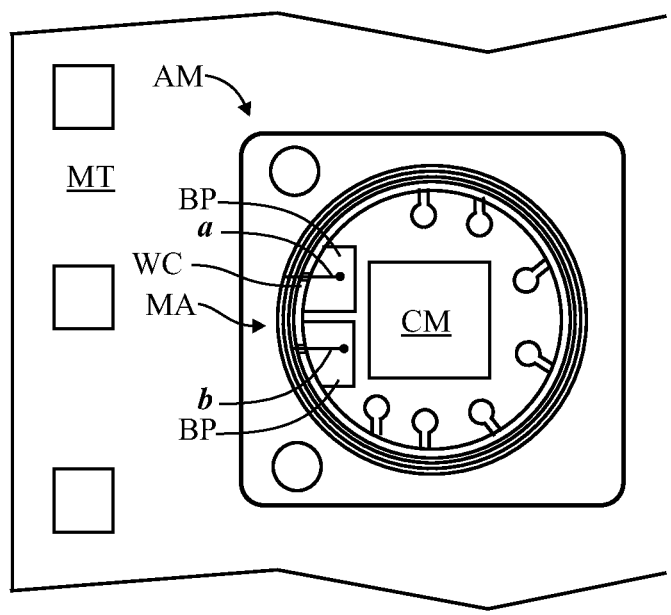
FIGS. 2B, 2C are plan views of the underside of a module tape (MT) for an antenna module (AM).

FIG. 2B illustrates a technique for forming one of many module antennas MA on a winding core WC on a 35 mm chip carrier tape (module tape MT). The two ends a, b of the module antenna MA wire may extend inward (such as though one or more slots in the winding core WC), for bonding to bond pads BP disposed on the module tape MT internal to the winding core WC. Alternatively, the winding core WC may be omitted, and the module antenna MA may be an air-core coil.

Figure 2C:
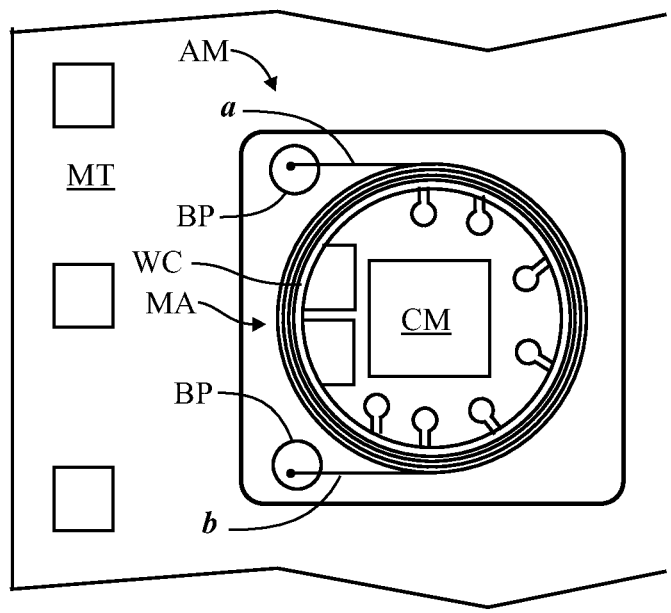

FIG. 2C illustrates a technique for forming one of many module antennas MA on a winding core WC on a 35 mm chip carrier tape (module tape MT). The two ends a, b of the module antenna MA wire may extend outward for bonding to bond pads BP disposed on the module tape MT external to the winding core WC (in the manner shown in FIG. 2). Alternatively, the winding core WC may be omitted, and the module antenna MA may be an air-core coil.

illustrates a technique for forming module antennas MA's on winding cores WCs, for example on a 35 mm chip carrier tape (module tape MT). The two ends a, b of the module antenna MA wire may extend outward, and are connected to bonding pads BP on the module tape MT external the winding core WC. Alternatively, the winding core WC may be omitted, and the module antenna may be an air-core coil.

In FIGS. 2B and 2C, a square pad is shown for receiving the chip CM. A number of smaller bond pads are shown inside the winding cores WC which are connected internally to the module tape to the contact pads CP (not shown) on the face-up side of the module tape MT, and various contact terminals of the chip may be wire bonded thereto, followed by glob-top filling of the winding core WC to protect the wire bonds. In FIGS. 2B and 2C, some interconnects are shown, others may be omitted, for illustrative clarity.

"Flyer" Coil Winding

Figure 3:
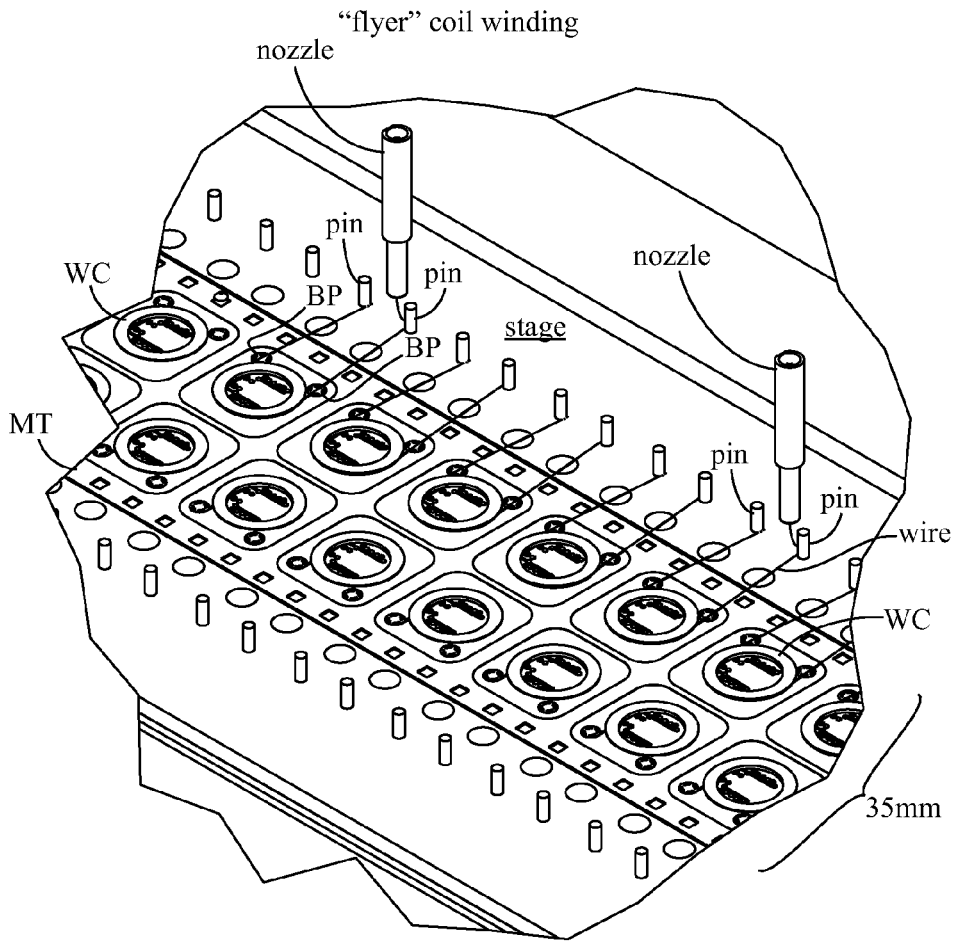
FIG. 3 is a perspective view and FIG. 3A is a plan view of techniques for forming module antennas (MAs), such as on winding cores (WCs) of antenna modules (AMs).

FIG. 3 illustrates a plurality (approximately fifteen) of module antennas MA, such as the type shown in FIG. 2C (ends extending outward from WC) being wound on winding cores WC, on a 35 mm chip carrier tape (module tape MT). The winding cores WC may be disposed in two rows, two winding cores WC conveniently fitting side-by-side across the width of the 35 mm carrier tape. The 35 mm chip carrier tape may advance along a stage, stopping to have a number (such as two) of modules antennas MA wound at a time. A plurality (such as fifteen) of pairs of retractable "fixation" pins extend from the stage, adjacent the 35 mm carrier tape, on both sides thereof, each pair of pins being associated with each of the (fifteen) winding cores WC. A lesser number (fewer), such as two, of nozzles may be provided for supplying and winding the wire for the module antenna MA around a like number (such as two) of wire cores WC.

Generally, to form a given module antenna MA, the nozzle may first wrap a first end of the wire around a first of the pair of pins, securing (anchoring, "fixing") the first end of the wire to the first pin. The nozzle then moves towards the winding core WC, a first end portion of the wire extending (passing) over (across) a first of two bond pads BP on the module tape MT. Then the nozzle "flies" (orbits) around the winding core WC, a number (such as twenty) of times, winding the wire around the winding core WC—hence, the nomenclature "flyer" winding technique. After completing the designated number (such as twenty) of turns, the nozzle heads away from the winding core WC, a second end portion of the wire passing over a second of the two bond pads for the module antenna MA, to secure (tie off) the second end of the wire on the second of the pair of pins. Then the end portions of the wire passing over the two bond pads BP for the module antenna MA may be bonded to the respective bond pads.

It may be convenient to first form a plurality of module antennas MA, before bonding the end portions of the module antennas BP. Note in the figure that several/(six) module antennas MA have already been formed, with their two end portions extending over bond pads BP and tied off to a corresponding pairs of pins. Then, in a subsequent step, the end portions of the module antennas MA can be bonded (such as using a thermode) to the respective bond pads BP. After completing formation of the module antennas MA, residual portions (between the bond pads BP and associated pins) of the ends of the wire may be cut, the pins retracted, and "waste" wire removed such a with a suction system.

The formation of the module antenna MAs and bonding of their end portions to respective bond pads BP may be performed prior to inserting the chip CM onto module tape MT. By completing these steps before wire bonding of the chip CM (see, for example, FIG. 4D), the wire bonds to the chip CM will not disturbed during bonding of the ends of the module antenna MA.

Figure 4:
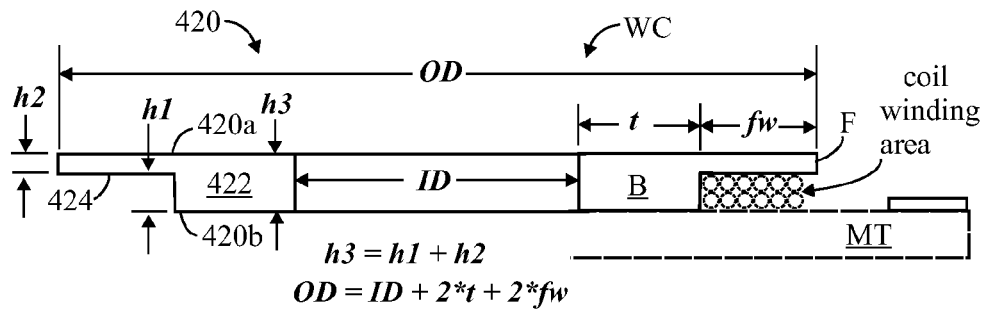
FIG. 4 is a cross-sectional view of a winding core (WC) upon which a module antenna (MA) may be wound.

The flyer winding technique illustrated in FIG. 3 is applicable to winding a module antenna MA on the dam structure DS of FIGS. 2, 2A, as well as on the dam structure WC of FIG. 4.

The following patent relating to flyer winding are incorporated by reference herein: U.S. Pat. No. 5,261,615 (1993, Gustafson); U.S. Pat. No. 5,393,001 (1995, Gustafson); U.S. Pat. No. 5,572,410 (1996, Gustafson); U.S. Pat. No. 5,606,488 (1997, Gustafson); U.S. Pat. No. 5,649,352 (1997, Gustafson)

Figure 3A:
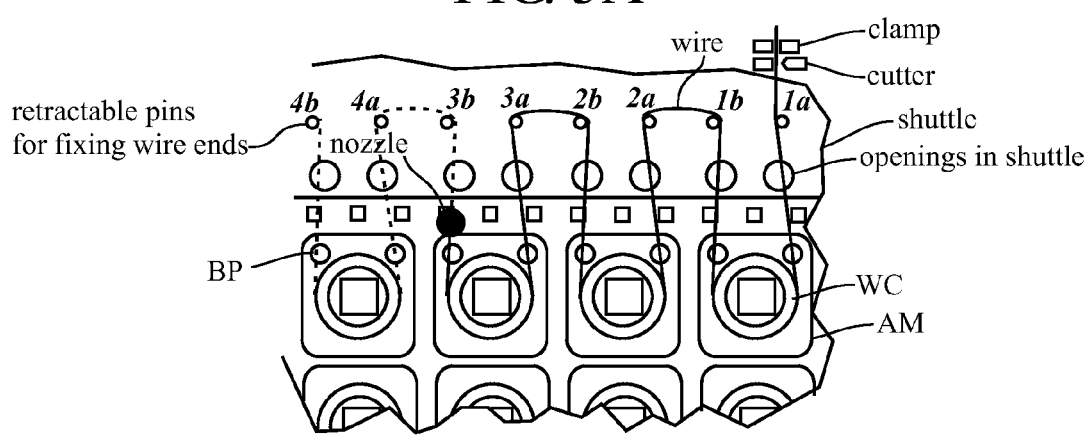

FIG. 3A shows some additional detail and/or variation(s) on the technique described above. A row of four antenna modules (AMs) being formed are shown disposed along one side of a 35 mm carrier tape. A plurality of tubular, open-ended support structures (WC, DS) have been placed at a corresponding plurality of sites for forming a corresponding plurality of antenna modules AMs. A plurality of retractable fixation pins for the wire ends are integrated into the shuttle (stage). A pair of these pins (labeled #a, #b) is located adjacent the carrier tape at each corresponding site for an antenna modules. An exemplary method of forming a sequence of module antennas MAs at sites for antenna modules AMs may comprise some or all of the following steps, in generally (but not limited to) the following sequence . . .

The wire may be clamped by a clamping mechanism.

The wire may then be guided by the nozzle past a first pin 1a of a first pair (1a, 1b) of retractable fixation pins associated with a first (shown at the right) of the antenna modules AMs.
  The winding nozzle may be controlled by an x-y-z servo system (not shown)

The wire may then be guided past a first opening in the shuttle to a first of the winding cores WC associated with the first antenna module AM
  The openings in the shuttle may facilitate disconnection of the wire during bonding (occurs later)

The nozzle then moves (orbits) around the winding core WC, forming a predetermined number (such as 20) of turns of wire for the module antenna MA The nozzle is then guided outwards, past the edge of the 35 mm carrier tape, passing over a second opening in the shuttle, to the second 1b of the first pair of retractable pins associated with the first antenna module Then, rather than tying the wire off on the second pin 1b, the nozzle guides the wire partially (such as approximately 90 degrees) around the second pin 1b towards a first pin 2a of a next pair of pins (2a, 2b) associated with a next (second from the right) of the antenna modules. This partial wrap of the wire may be sufficient to anchor (secure) the wire to the pin 2a.

Then, the nozzle guides the wire around the pin 2a towards the wire core of the second (from the right) antenna module, passing over another opening in the shuttle.

The nozzle then moves (orbits) around the second winding core WC, forming a predetermined number (such as 20) of turns of wire for the module antenna MA.

The above steps (nozzle guided outward over an opening in the shuttle to a second pin of a pair of retractable pins, to a first pin of a next pair of retractile pins, wrapping partially around (securing the wire) and being guided inward over an opening in the shuttle to a next winding core, etc.) continues until a last winding core has been wound with a module antenna MA. Then the wire can be tied off (by the nozzle) around the second pin (4b) of the last pair of retractable pins (4a, 4b).

In FIG. 3A, the nozzle is shown exiting the third (from the right) winding core, headed towards the second of the pair of pins 3a, 3b associated with that antenna module site.

The end portions of the wire passing over respective bond pads BP may then be bonded, as described above with respect to FIG. 3.

In a last step, the wire can be cut, pins retracted, and residual wire removed.

Single-Flange Winding Core

FIG. 4 illustrates a winding core WC 420 upon which a module antenna MA may be wound. The winding core WC, which may be referred to as a "support structure", may be made of a plastic material, such as glass fiber reinforced PPS (Polyphenylene Sulfide). As with the dam structure DS 220, the winding core WC may be in the form of a ring, or tubular structure, having a circular or substantially rectangular cross-section, and two opposite open ends 420a, 420b, one of which ends will be secured (affixed) to the underside of a module tape MT, the other of which is a free end (un-mounted).

The winding core WC comprises a main body portion B 422, and a flange portion F 424 extending radially (to the left or right, as viewed) outward from the top (as viewed) free end of the body portion B. (This is in contrast with the dam DS 220 in which both ends are essentially the same as one another.)

The flange F serves to stiffen the body portion B, and also to constrain (contain) the windings of the module antenna MA as it is being wound. By way of analogy, when installed on the module tape MT, the flange F serves as one flange of a "bobbin", the surface of the module tape MT serves as the second flange of the "bobbin". The module antenna MA will be wound in a coil winding area between the two "bobbin" flanges. FIG. 4 shows a portion of the module tape MT in phantom (dashed lines), and indicates the coil winding area formed between the flange F and the underside surface of the module tape MT. (The module tape MT may be epoxy-glass, copper-clad on both sides, etched to form bond pads BP on the underside, contact pads CP on the face-up side.)

The winding core WC 420 may have the following dimensions (approximate):
  thickness t of the body portion B=~0.85 mm
  width fw of the flange F=~0.5 mm
  outer diameter OD of the winding core WC (including flange F)=~9.4 mm
  inner diameter ID of the winding core WC=~6.7 mm
  height h1 of coil winding area=~0.250 mm
  height h2 of the flange F=~0.100 mm
  overall height h3 of the body portion B=~0.350 mm The coil winding area between the flange F and the surface of the module tape MT may accommodate (contain) approximately 20 turns of 112 μm diameter self-bonding wire for the module antenna MA. Wire having other diameters, greater or less than 112 μm may be used for the module antenna MA.

Figure 4A:
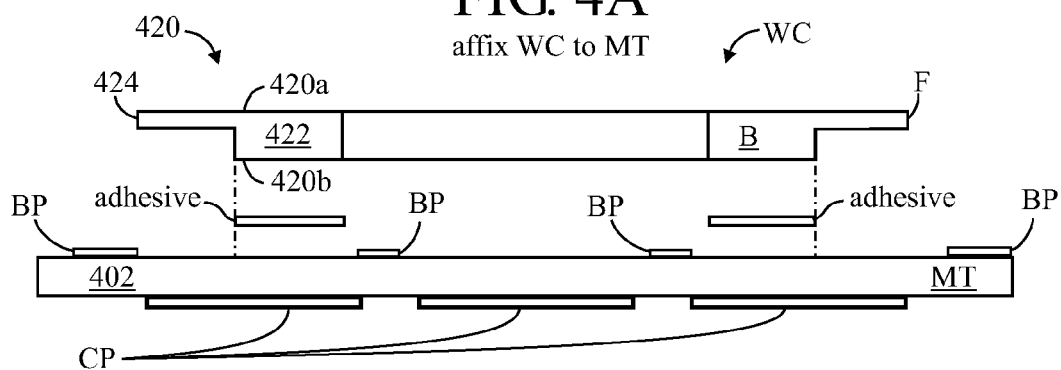
FIGS. 4A-4F are cross-sectional views showing forming an antenna modules (AM) having its module antenna (MA) on a winding cores (WC).

A process for forming a module antenna MA 430 on the winding core WC, further forming an antenna module AM is described with respect to FIGS. 4A-4F, and generally comprises:

fix WC to MT
wind MA on WC
dispense adhesive for the CM
place CM, cure adhesive (cure self-bonding wire)
wire bonding (CM and MA to BPs on MT)
glob top fill interior of WC (covering CM)
overmold MA, WC, CM FIG. 4A illustrates a first step, wherein the winding core WC 420 is affixed to the module tape MT, such as with an adhesive. The adhesive may be applied to either of the end 420b of the winding core WC or the surface of the module tape MT. The final thickness of the adhesive may be approximately 30 μm. Alternatively, the winding core WC may be affixed to the module tape MT without adhesive, such as by spin-welding (a frictional welding technique). In a production process, a winding core WC (or simply "ring") may be placed at a plurality of locations along a 35 mm carrier tape in preparation for coil winding (winding of the module antenna MA on the winding core WC, or dam DS). This step may be referred to as "ring placement".

Contact pads CPs (compare 104) for a contact interface (with an external reader) are shown in on the face-up (bottom, as viewed) surface of the module tape MT, for a dual interface (DI) antenna module AM. However, is should be understood that the invention can be practiced in the context of an antenna module AM that operates solely in contactless mode, without such contact pads CP.

Figure 4B:
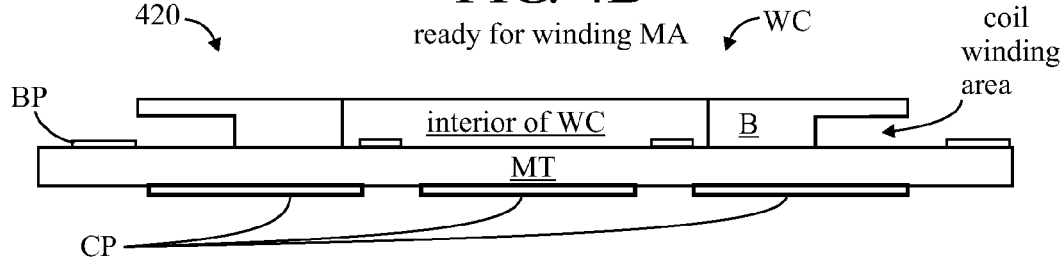

FIG. 4B illustrates the winding core WC affixed (assembled, mounted) to the module tape MT. A coil winding area is formed between the flange F and the surface of the module tape MT. In this and in subsequent figures, the adhesive is omitted, for illustrative clarity.

Figure 4C:
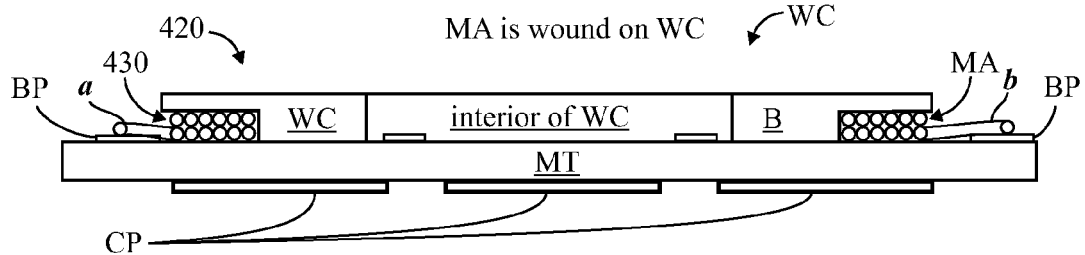

FIG. 4C illustrates a next step, wherein the module antenna MA 430 is wound on the winding core WC, around the body portion B, in the coil winding area between the flange F and the surface of the module tape MT. This may be done in the manner shown in and described with respect to FIG. 3 (using the "flyer" winding technique). Other coil winding techniques may be used to form the coils of the module antenna MA. The ends (a, b) of the module antenna MA, extending outward from the winding core WC, may be connected with respective bond pads BP in this step. Although not shown, the winding core 420 may have at least one slot (S), comparable to the at least one slot (S) shown in FIG. 2B, to allow the ends (a, b) of the module antenna MA to extend to bond pads (BP) located the inside of the winding core WC.

The coils (turns) of wire may not be so neatly arranged, as illustrated. Nevertheless, the coils (turns) of wire are constrained within the coil winding area by the flange F and the surface of the module tape MT, as shown. The module antenna MA may comprise a total of 20 turns (coils) of wire in the coil winding area, and two ends (a, b) extending over respective bond pads BP on the surface of the module tape MT.

Figure 4D:
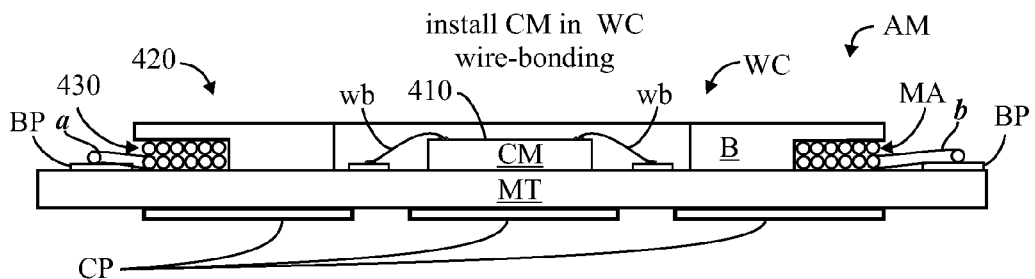

FIG. 4D illustrates a next step of forming the antenna module MA, wherein the chip CM (compare 110) is installed in the interior area of the winding core WC. Then, wire bonds wb (compare 114a, 114b) may be formed between the terminals (compare 110a, 110b) of the chip 110 and selected ones of the bond pads BP on the surface of the module tape MT. The ends (a, b) of the module antenna MA may also be bonded to the selected ones of the bond pads BP on the surface of the module tape MT in this step, if they were not previously connected.

Figure 4E:
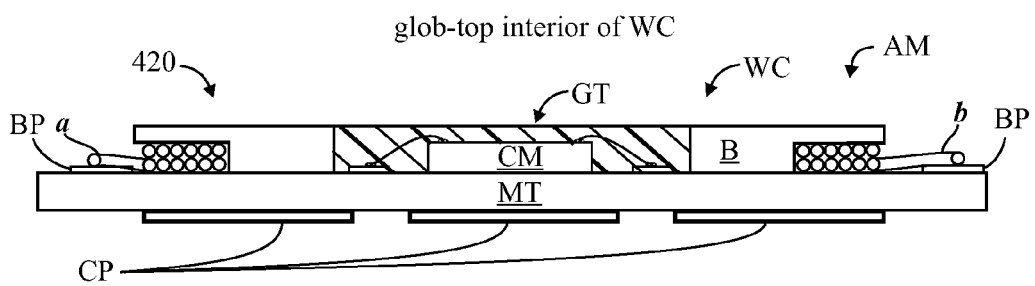

FIG. 4E illustrates a next step, wherein the interior area of the winding core WC may be filled with glob-top potting compound GT, or the like, to protect the chip CM and wire bonds wb. If heat is applied to cure the glob-top GT, the heat may also cause sticking together of the self-bonding wire forming the turns (coils) of the module antenna MA.

Figure 4F:
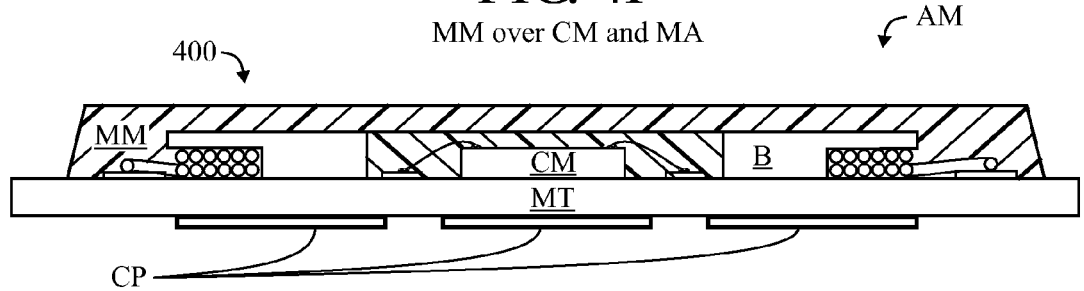

FIG. 4F illustrates a next step, wherein a mold mass MM may be formed (by overmolding) over the module antenna MA, the ends (a, b) of the module antenna MA, the winding core WC, the glob-top GT (including over the chip CM and wire bonds). The mold mass MM may extend over the outer edge (lip) of the flange F, slightly into the coil winding area (except where there is wire), which may helping retain the mold mass MM in place. To a lesser extent, the dam structure DS (FIG. 2), which is also affixed at one end to the module tape MT, if used in lieu of the winding core WC, may also help to support (retain, capture) the mold mass MM.

The process of forming a module antenna MA for an antenna module AM described above may be contrasted with Toppan '774 which shows (FIG. 14) a coil wound around a coil frame or core having flanges mounted around the epoxy resin protecting the die and wire bonds to the die. For example, in the technique described above (FIGS. 4A-4F) . . .

the winding core WC has only one flange (the other "virtual" flange at the opposite open end of the support structure being the surface of the module tape MT),
the tubular support structure (WC, DS) may serve as a dam for containing later-applied glob-top GT resin,
the chip CM may be installed after the module antenna MA is formed upon the module tape MT (and the wire bonds to the chip CM also being performed after bonding the ends of the module antenna MA)

Figure 5:
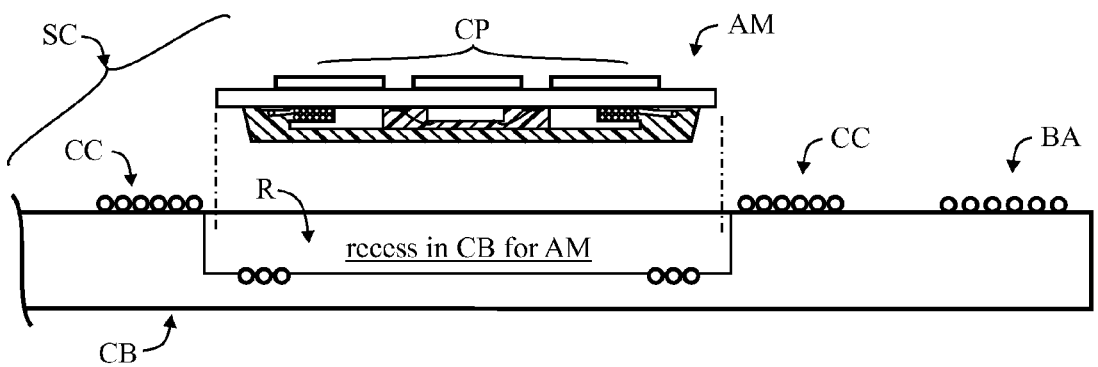
FIG. 5 is an exploded cross-sectional view showing an antenna module (AM) being installed in a card body (CB) of a smart card (SC).

FIG. 5 (compare FIG. 1) illustrates the antenna module AM, which could be the antenna module 200 of FIG. 2 or the antenna module AM 400 of FIG. 4F, installed in a recess R in a card body CB of a smart card SC having a booster antenna BA having an outer portion at the periphery of the card body and a coupler coil CC at an interior area of the card body, such as surrounding the recess R. At least some (including all) of the turns of wire of the coupler coil CC may be embedded in the bottom of the recess R, to enhance the inductive (transformer) coupling between the coupler coil CC and the module antenna MA. Channels or a wide trench for receiving the turns of wire in the bottom of the recess R may be formed by laser ablation.

An Exemplary Antenna Module (AM)

Figure 6A:
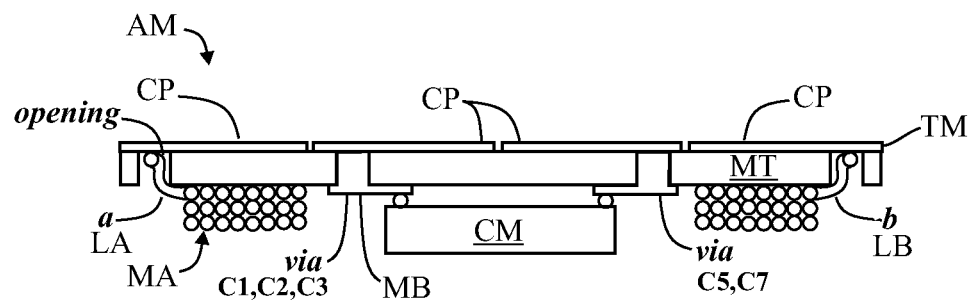
FIG. 6A is a cross-sectional view of an antenna module (AM) having a double-sided module tape (MT) with vias and openings extending through the module tape (MT).

FIG. 6A illustrates an antenna module AM having a double-sided tape, with openings in the module tape MT for the connection of the ends (a, b) of the module antenna MA to the undersides of contact pads CP (or other areas of top metallization). The bottom metallization BM may be removed from under the module antenna MA since it is not needed for interconnecting the module antenna MA with the chip CM. Conductive vias are provided through the module tape MT for connecting the chip CM to contact pads CP. Here it is shown that rather than wire-bonding the chip CM to the vias (as in FIG. 7A), the chip CM may be flip-chip (ball) bonded to selected traces in the bottom metal layer MB which are associated with those vias. Underfiller may be provided under (on top, as viewed) of the chip CM to support it on and secure it to the module tape MT.

Figure 6B:
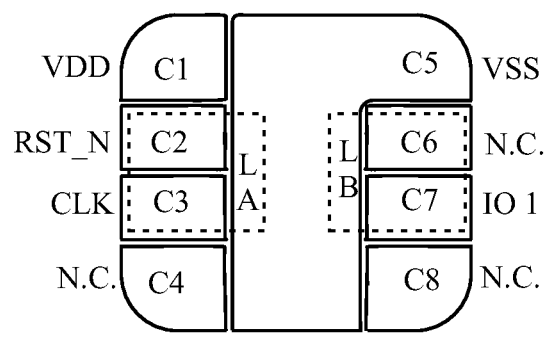
FIG. 6B is a diagram showing exemplary contact pad (CP) layout/assignments for the antenna modules (AM).

FIG. 6B illustrates contact pad layout/assignments relevant to FIG. 6A. The wire ends (a, b) of the module antenna MA may be connected to LA and LB on the underside of the module tape MT.

It may be advantageous to remove metal, such as by laser ablation (or laser percussion drilling) from the contact pads CP of the antenna module AM to improve the electromagnetic coupling (read distance) with a external contact reader (FIG. 1). This removal of metal from the contact pads (CP) can take various forms, such as a providing a plurality of perforations through selected ones of the contact pads, modifying the size of selected ones of the contact pads, or increasing the size of a gap between selected ones of the contact pads CP, or the like, such as may be described in 61/693,262 filed Aug. 25, 2012.

Module Antenna (MA) Having One Coil

Summarizing the above, a winding core WC, generally in the form of a ring, or tubular structure having two ends, is mounted to the top (as viewed) surface of a chip carrier tape MT (or module tape, MT). The end of the winding core WC away from the carrier tape MT has a flange F. A coil winding area between the flange F and the top surface of the carrier tape MT may accommodate (contain) several (such as 20-30) turns of wire, such as 112 μm diameter self-bonding wire, to form a module antenna MA, which may be formed using a flyer winding technique. Ends "a", "b" of the module antenna MA may be bonded to two bond pads BP-a and BP-b on the top surface of the carrier tape MT.

Bond pads "bp" may also be disposed on the top surface of the carrier tape MT, in the interior area of the winding core WC, for connecting (such as by wire bonding) with an RFID chip (not shown) later to be disposed within the winding core WC on the top surface of the carrier tape MT. Each of the bond pads "bp" is associated with a given one of the bond pads BP-a and BP-b, connected by conductive traces (not shown) therewith. Contact pads CP for a contact interface (ISO 7816) may be disposed on the bottom (as viewed) surface of the carrier tape MT, and connected such as by vias (not shown) to additional bond pads (not shown) on the top surface of the carrier tape MT (in the interior area of the winding core WC) which will also be connected with the RFID chip.

Figure 7:
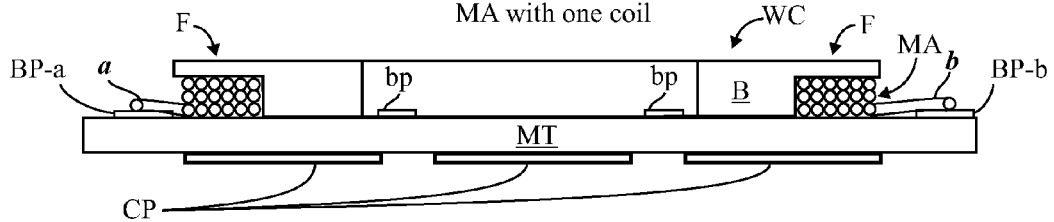
FIG. 7 is a diagram in cross-section showing a module antenna (MA) having one coil.

FIG. 7 (compare FIG. 4C) shows a module antenna MA formed by one coil having a total of 18 turns, and having two ends "a" and "b", both ends extending outward from the module antenna MA and connected with a respective one of two bond pads BP-a and BP-b on the carrier tape MT.

The wire may generally be wound around the body portion B of the winding core WC one turn atop the other, expanding radially outward as the winding area between the carrier tape MT and the flange F becomes filled with wire—resulting, for example, in three (3) layers of wire, each layer having six (6) turns.

Figure 7A:
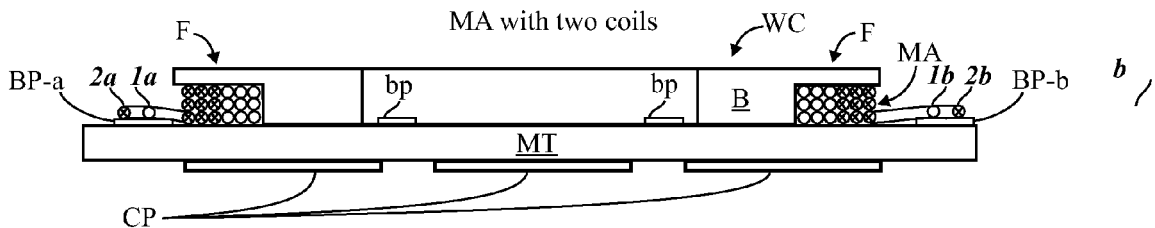
FIG. 7A is a diagram in cross-section showing a module antenna (MA) having two coils.

FIG. 7A shows diagrammatically a module antenna MA comprising two coils C1 and C2, each of the coils having 9 turns, the overall module antenna MA having a total of 18 turns. Each of the coils C1 and C2 has two ends. Coil C2 is shown with "X's". Coil C2 is shown wound around the coil C1. The module tape MT is shown as being double-sided, but may be single-sided.

Figure 7B:
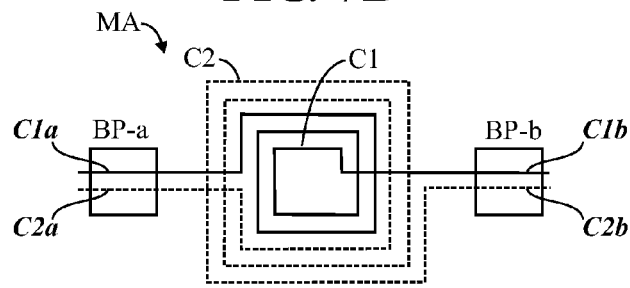
FIG. 7B is a diagram showing connecting the two coils of the module antenna (MA).

FIG. 7B shows schematically that the two coils C1 and C2 may be connected in parallel with one another. Coil C2 is shown in dashed lines. (The two coils C1 and C2 may be connected in a different manner, as shown in FIG. 7D.)

The coil C1 may be the first coil wound on the winding core WC, and may comprise 9 turns of wire and two ends 1a, 1b.

The coil C2 may be the second coil wound on the winding core WC, and may comprise 9 turns of wire and two ends 2a, 2b.

A first end 2a of the second coil C2 may be connected with a first end 1a of the first coil C1 at a first bond pad BP-a. A second end 2b of the second coil C2 may be connected with a second end 1b of the first coil C1 at a second bond pad BP-b.

The module antenna MA having two coils C1, C2 (FIGS. 7A, 7B) may couple better with a booster antenna BA on the card body, or directly with an external contactless reader, when contrasted with a comparable (substantially the same size, same total number of turns, etc.) module antenna MA having but a single coil (FIG. 7), resulting in a greater read-write distance and energy harvesting, and potentially rendering the booster antenna BA superfluous. This may be attributable to the RF signal being radiated (or received) by the two coils reinforcing one another, or a higher quality factor (Q), or another characteristic of the two coil versus one coil approach including, perhaps, capacitance formed by the parallel connected ends of the two coils.

It is generally not necessary that the turns of the coils (C1, C2) be so neatly stacked as shown. Generally, it is sufficient to fill the entire winding area between the flange F and the carrier tape MT with turns of the module antenna MA, whether one coil (FIG. 1A) or two coils (FIG. 1B). It should also be understood, particularly with reference to the two coil embodiment (FIG. 1B) that

- the two coils C1 and C2 can be wound either in the same or in opposite directions from one another
- the two coils C1 and C2 may have non-equal numbers of turns, for example the inner coil C1 having 10-12 turns and the outer coil C2 having 6-8 turns—more generally, the outer coil C2 having fewer (or more) turns than the inner coil C1.
- the two coils C1 and C2 may be connected in parallel with each other—the inner end 1a of the inner coil C1 being connected with the inner end 2a of the outer coil C2, and the outer end 1b of the inner coil C1 being connected with the outer end 2b of the outer coil C2
- the two coils C1 and C2 may be connected in parallel with each other—the inner end 1a of the inner coil C1 being connected with the outer end 2b of the outer coil C2, and the outer end 1b of the inner coil C1 being connected with the inner end 2a of the outer coil C2
- the two coils C1 and C2 may be connected other than in parallel with each other, for example the inner end 1a of the inner coil C1 being connected with the outer end 2b of the outer coil C2, with the outer end 1b of the inner coil C1 being connected to one terminal of the RFID chip (via a bond pad) and the inner end 2a of the outer coil C2 being connected with another terminal of the RFID chip (via another bond pad).

Additionally, it is not necessary that the two coils C1 and C2 of the module antenna MA be arranged as an inner coil and an outer coil. Rather . . .

- one coil could be formed (wound) atop the other, rather than inside or outside of the other
- the various turns of the two coils can be interleaved with one another
- the two coils C1 and C2 may be wound simultaneously (both at once), in the manner of a bifilar coil Additionally, the following variations may be implemented . . .

Figure 7C:
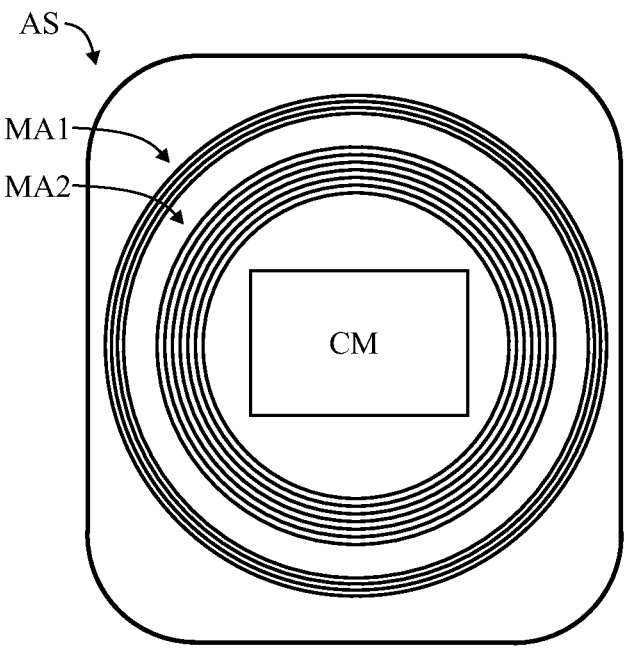
FIG. 7C is plan view of the underside of a module tape (MT) for an antenna module (AM), showing an antenna structure (AS) having two antenna segments (MA1, MA2).
Figure 7D:
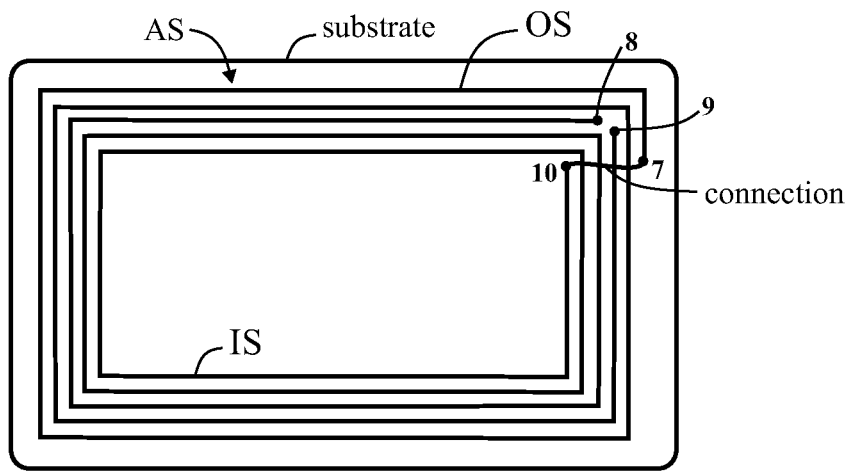
FIG. 7D is a diagrammatic view of an antenna structure (AS).

- the coils C1 and C2 need not be wound on the specific winding core(s) illustrated above. They may be wound on other cores, directly on resin or mold mass encapsulating the RFID chip, may be air core coils, etc.

the coils C1 and C2, shown above as being concentric with one another, may be formed in a manner that is not concentric the module antenna MA may comprise more that two coils, such as three coils (C1, C2, C3), each having six turns (for an 18-turn MA)

the coils C1 and C2 need not be formed of wire, they may be formed as electrical traces using any additive (such as printing) or subtractive (such as etching) process ferrite material (such as a film, or particles) may be incorporated into the winding core WC, on the carrier tape MT, or in a coating (such as the insulating coating) on the wire capacitive elements may be formed in or on the carrier tape and connected with one or both of the coils Module Antenna with Two Segments FIG. 7C (comparable to FIG. 6A of 61/693,262) illustrates the underside of a module tape MT for an antenna module (AM). An antenna structure (AS) for a module antenna (MA) is shown, comprising two module antenna segments MA1 and MA2. These two module antenna segments MA1, MA2 may be arranged concentric with one another, as inner and outer antenna structures. Both module antenna segments MA1, MA2 may be wound coils, or patterned tracks, or one may be a wound coil and the other a pattern of tracks. The two module antenna segments MA1, MA2 may be interconnected with one another in any suitable manner to achieve an effective result.

FIG. 7D (comparable to FIG. 6B of 61/693,262) illustrates an exemplary antenna structure AS which may be used in an antenna module AM, having two segments (compare MA1, MA2) which are interconnected with one another, the antenna structure comprising an outer segment OS having an outer end 7 and an inner end 8 an inner segment IS having an outer end 9 and an inner end 10 the outer end 7 of the outer segment OS is connected with the inner end 10 of the inner segment IS the inner end 8 of the outer segment OS and the outer end 9 of the inner segment IS are left unconnected this forms what may be referred to as a "quasi dipole" antenna structure AS.

Such an arrangement is shown in Ser. No. 13/205,600 filed Aug. 8, 2011 (pub 2012/0038445, Feb. 16, 2012) for use as a booster antenna BA in the card body CB of a smart card SC Such an arrangement is shown in Ser. No. 13/310,718 filed Dec. 3, 2011 (pub 2012/0074233, Mar. 29, 2012) for use as a booster antenna BA in the card body CB of a smart card SC The contact pads CP and antenna structures AS described herein may be formed using laser etching (isolation technique) of copper cladded "seed" layers on a module tape MT using a UV nanosecond or picosecond laser.

The module antenna MA which encircles the chip CM may serve as a dam for glob-top which is applied to protect the chip CM and its connections to the module tape MT. See FIG. 1B, above. See also FIG. 7A of U.S. 61/595,088.

Rather than (or in some cases, in addition to) using glob-top, protection may be achieved by transfer molding a mold mass (MM), which covers/protects the module antenna MA as well as the chip CM and its connections. The chip CM may be mounted to the module tape MT before, or after mounting the module antenna MA to the module tape (and before transfer molding).

61/704,624, incorporated by reference herein, discloses an antenna module (AM) for a smart card (SC) comprising: a module tape (MT); a chip (CM) disposed on a surface of the module tape (MT); and a module antenna (MA) disposed on the surface of the module tape (MT), and connected with the chip (CM); characterized by: the module antenna comprises a first coil (C1) and a second coil (C2). The first and second coils may be connected in parallel with one another. The second coil (C2) may be wound around the first coil (C1). The second coil (C2) may have substantially the same number of turns as the first coil (C1). The first and second coils may be wound in the same direction as one another. An antenna module (AM) may be made by affixing a tubular support structure (DS, WC) on a surface of a module tape (MT); and winding a wire for a module antenna (MA) around the tubular support structure (DS, WC); characterized in that the module antenna comprises two coils (C1, C2). The module antenna (MA) may be wound using a flyer winding technique.

Figure 7E:
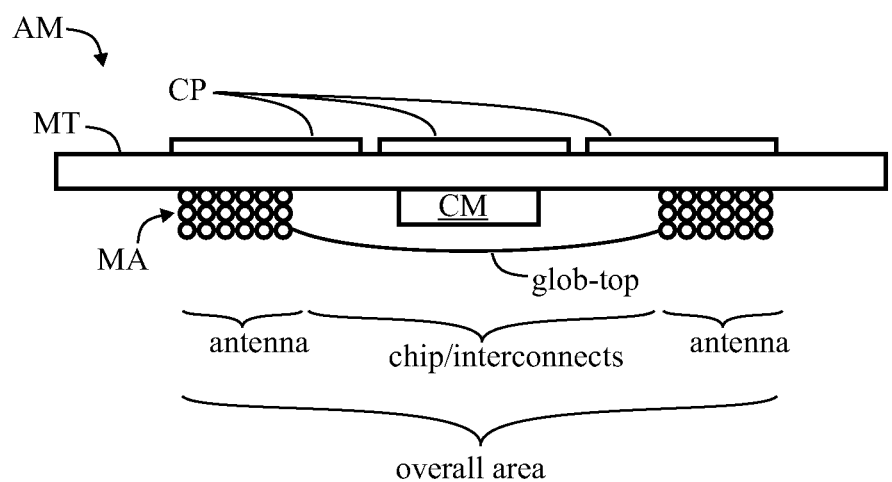
FIG. 7E is a diagram showing glob top over a chip (CM) of an antenna module (AM).
Figure 7F:
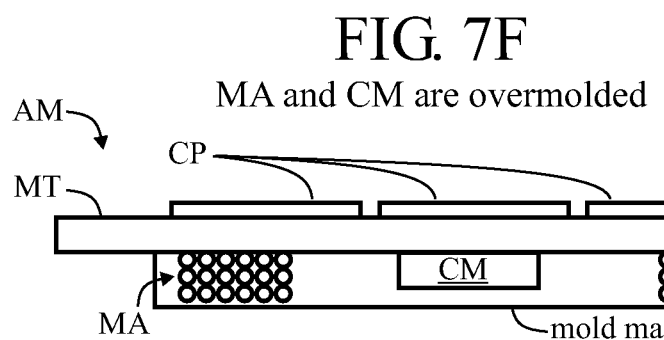
FIG. 7F is a diagram showing overmolding a chip (CM) and module antenna (MA) of an antenna module (AM)

FIGS. 7E, 7F show an antenna module AM having a carrier substrate or tape MT, an RFID chip CM on the bottom (as viewed) side of the substrate MT, an antenna MA also mounted to the bottom side of the substrate MT, and ISO 7816 contact pads CP on the top (as viewed) side of the substrate MT. In FIG. 7E, glob top (compare FIG. 4E) is applied over the chip CM (and connections, if any), with the antenna MA serving as a dam to contain the glob top. In FIG. 7F, a mold mass (compare 4F) is disposed over the chip CM (and glob top, if any) and the antenna MA.

As illustrated, the antenna MA and chip CM are located directly under and are of commensurate size (occupy approximately the same overall area) as the contact pads CP. With regard to the area between the chip CM and the antenna MA, this is typically used for interconnections (compare FIGS. 2B, 2C) and is generally not available or usable for the antenna MA, thereby limiting the amount of area available for the antenna to only an outer portion of the overall area (see FIG. 7E).

It should be appreciated that more area allows for more antenna windings or turns, and as a general proposition, more is better. As discussed in greater detail below, this "problem" of space available for the antenna MA is of particular concern when trying to fit an etched antenna having a pattern of tracks in the limited area, and is greatly exacerbated when trying to incorporate an antenna in a 6-pad module which is significantly smaller than an 8-pad module.

Flip Chip on Substrate (FCOS)

FIGS. 8A and 8B reprise some prior art shown in FCOS™ Chip On Substrate, by Infineon Technologies AG, which is directed to memory and microprocessor cards which are contact-type cards. Two "chip modules" are shown, comprising an IC chip (comparable to what has been referred to hereinabove as chip or chip module "CM") mounted to one side of a carrier substrate (FR4, PET) or tape (comparable to what has been referred to hereinabove as module tape MT), the IC chip (CM) being connected ISO contacts (comparable to what has been referred to hereinabove as contact pads CP) disposed on the other side of the substrate. The chip modules do not have antennas (module antenna MA) incorporated therewith. Mention is made of 6-contact and 8-contact chip modules—in other words, chip modules having 6 or 8 contact pads.

FIG. 8A shows a standard chip module cross section, having an IC chip (CM) mounted to one side of a FR4 substrate (referred to as "card body", compare module tape MT) and ISO contacts (contact pads, CP) on the other side of the substrate. The IC chip is wire bonded to the undersides of contact pads on the other side of the substrate. This is representative of a "single-sided" module tape (substrate) that has metallization which is patterned, on only one side of the tape. The IC chip and wire bonds are encapsulated.

FIG. 8B shows an FCOS™ card, having an IC chip mounted with a non-conductive adhesive (NCA) to one side of a PET substrate, and electrical chip connections which are bumps (rather than bond wires). The substrate has conductive traces on its bottom surface. The IC chip is flip-chip mounted to the conductive traces, which connect with conductive vias extending through the substrate to the underside of the ISO contacts. This is representative of a "double-sided" module tape (substrate) that has metallization which is patterned, on both sides of the tape. (Compare FIG. 6A.)

As noted by Infineon, flip chip technology refers to a process of interconnecting semiconductor chips with carriers. The technology makes it possible to increase the packing density of elements on a carrier and allows for a more direct and more stable electrical interconnection compared to wire bond technology. Unlike wire bond technology, which has been almost exclusively used in smart card modules up to now, the flip chip process involves flipping the chip, i.e. its electrical interconnections (pads) are turned toward the carrier side. In addition, there is no need for encapsulation (glob top). The electrical interconnection is made using conductive materials, so-called bumps, located between the chip contacts and carrier. The system is held together mechanically by means of an adhesive between the chip and carrier. As a result of the development of new materials for flip chip technology and optimization of the production process, it is now possible to use flip chip technology in the area of smart cards.

Flip chip technology is well known, and there are many different techniques available for ball-bumping integrated circuit (IC) chips, such as, but not limited to the following, incorporated by reference herein:

U.S. Pat. No. 5,249,098 (1993, LSI Logic)
U.S. Pat. No. 5,381,848 (1995, LSI Logic)
U.S. Pat. No. 5,988,487 (1999, Fujitsu, Semi-Pac)
U.S. Pat. No. 6,293,456 (2001, SphereTek)

Some Problems being Addressed

A smart card, chip card, or integrated circuit card (ICC) is any pocket-sized card with embedded integrated circuits. Smart cards are made of plastic, generally polyvinyl chloride, but sometimes polyethylene terephthalate based polyesters, acrylonitrile butadiene styrene or polycarbonate.

Contact smart cards have a contact area of approximately 1 square centimeter (0.16 sq in), comprising several gold-plated contact pads. These pads provide electrical connectivity when inserted into a reader, which is used as a communications medium between the smart card and a host (e.g., a computer, a point of sale terminal) or a mobile telephone. Contactless smart cards, communicate with the external reader through RF induction technology, and require only proximity to an antenna to communicate. Dual-interface cards implement contactless and contact interfaces on a single card with some shared storage and processing. In the main, hereinafter, dual interface (DI, or DEF) cards are discussed. Reference is made to U.S. Pat. No. 6,378,774 (2002, Toppan) for an example of a DIF chip solution, and to US 2010/0176205 (2010, SPS) for an example of a two chip solution wherein one chip performs the contact function and the other chip performs the contactless function.

In the language of this patent application, the combination of an RFID chip (CM) on one side of a carrier substrate (MT) with contact pads (CP) on the other side of the substrate (MT), with the addition of an antenna (MA) disposed on the chip side of the substrate (MT) and connected with the RFID chip (CM) is termed "antenna module" ("AM").

The plastic card (card body CB) in which the chip module (such as Infineon) or antenna module (AM) is embedded is fairly flexible, and the larger the chip, the higher the probability that normal use could damage it. Cards are often carried in wallets or pockets, a harsh environment for a chip. It is therefore generally desirable that the chip modules (ISO-7816 only) or antenna modules (with the addition of ISO-14443) be as small as possible.

Figure 8C:
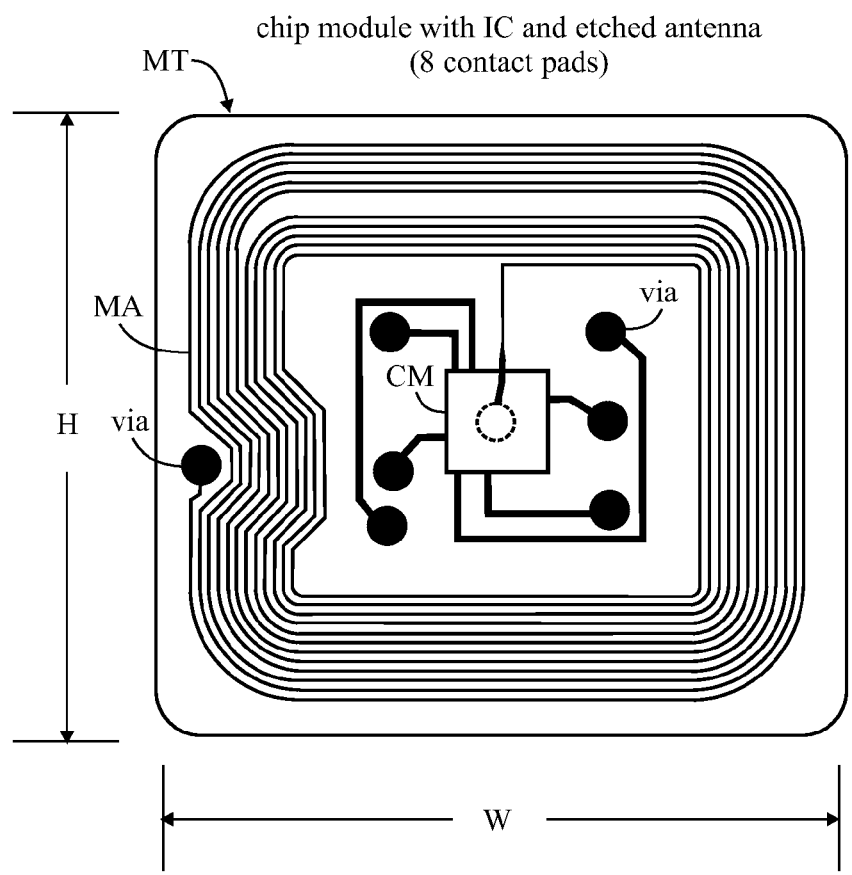
FIG. 8C is a plan view of a substrate with an antenna, such as for use with the chip module of FIG. 8B.

FIG. 8C shows an antenna structure MA disposed on the chip (IC) side of the substrate. A typical pattern for an antenna is generally rectangular, in the form of a flat (planar) coil (spiral) having a number (such 12) of turns (conductive tracks). The antenna is typically chemically etched from the metal layer (foil) on the chip side of the substrate. The 7 filled circles and the dashed line circle under the chip CM represent vias (a total of 8) through the substrate tape MT.

The RFID chip CM is typically disposed in the center of the spiral antenna pattern, making that space unavailable for turns of the antenna. Also, as mentioned above, a significant amount of space around the chip CM is unavailable for the etched antenna. The module being shown here has 8 contact pads. Some dimensions (all approximate) for the module may be, The overall size of the 8 pad module is W=13 mm×H=12 mm (12.8×11.8 mm) (A 6 pad module may measure W=12 mm×H=9 mm (11.8×8.8 mm)

Figure 8D:
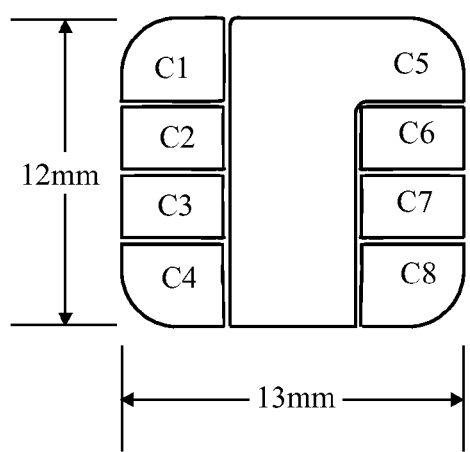
FIG. 8D is a diagram of an 8-pad pattern for ISO 7816 contacts.
Figure 8E:
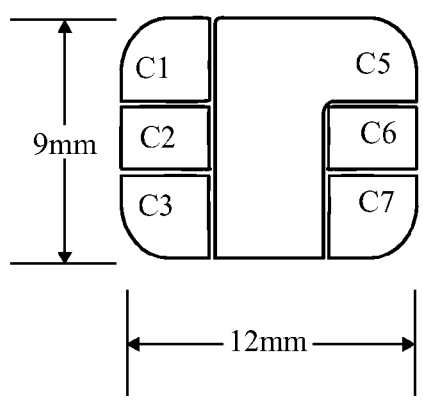
FIG. 8E is a diagram of a 6-pad pattern for ISO 7816 contacts.

The 8 contact pads (see FIG. 8D) occupy an area of approximately 13×12 mm$^2$ (A 6 pad design, FIG. 8E, may measure 12 mm×9 mm The antenna MA is shown having 12 "turns", or tracks.

Each track of the antenna MA has a width of 0.1 mm

A gap between adjacent tracks is 0.075 mm

The "pitch" (width+gap) of the tracks is 0.175 mm (0.1+0.075)

The outer dimension of the antenna MA is approximately 13 mm×12 mm

The chip CM measures 2 mm×2 mm

The inner dimension of the antenna MA is approximately 9 mm×8 mm. This is the area occupied by the chip CM and interconnects (and 7 of the vias).

Because of the restrictions on the size of the smart card module (e.g. 13×12 mm, or 12×9 mm), the number of turns forming the antenna is limited to the space surrounding the central position of the silicon die which is attached and bonded to the module substrate. This substrate is generally made of epoxy glass with a contact metallization layer on the face-up side and a bonding metallization layer on the face-down side of the module. The chemically etched antenna is usually formed on the face-down side.

Reference is made to ISO 7816, incorporated by reference herein. To provide some context, the overall dimensions of the card body, as defined by ISO 7816 are:

Width 85.47 mm–85.72 mm

Height 53.92 mm–54.03 mm

Thickness 0.76 mm+0.08 mm

The overall dimensions of the antenna are typically commensurate with the overall dimensions of the contact pads which (all dimensions are approximate), for a 8-pad contact pattern is 13.2 mm×11.8 mm, or 156 mm$^2$ (and each contact shall have a minimum rectangular surface area not less than 1.7×2 mm)

for a 6-pad contact pattern is 11.8 mm×8.8 mm, or 104 mm$^2$ Generally, for a 6-pad contact, the bottom two pads, C4 and C8 (reserved) of the 8-pad pattern (compare FIG. 6B) are omitted.

It is readily apparent that an area of approximately 1.4 mm×3 mm is lost around the perimeter of a 6-contact pad chip (or antenna) module, as contrasted with a comparable 8-pad contact pattern antenna module (AM), which results in the loss of at least approximately (1.4 mm/0.175 mm) 8 turns of antenna (etched)

The chip (IC) may measure 2 mm×2 mm, or 4 mm², and this area is unavailable for the antenna, leaving (all dimensions are approximate). Generally, an area immediately surrounding the IC chip may also be unavailable for the antenna, for example, 3 mm×3 mm (including the IC chip), or 10 mm²

It can thus be seen that all numbers approximate) a 6-pad contact pattern may approximately 30-50% less space available for the antenna than an 8-pad contact pattern module. And, an etched antenna is 2 dimensional, in one layer only.

In contrast with an etched antenna, a wire wound antenna may make much better use of the space available. FIGS. 1, 1A, 1B, 1C, 6A above show some examples of wire-wound module antennas (FIG. 7C shows antenna segments that may be wound coils, or patterned tracks.) FIGS. 2, 2B, 2C, 3, 3A, 4C-4F, 5, 7, 7A above show some examples of wire antennas wound around a dam (DS) or winding core (WC).

Another limitation in creating an inductive antenna through chemical etching is the minimum pitch (or spacing) between tracks, which is economically attainable using a lithographic process. The optimal pitch (or spacing) between (adjacent) tracks of an etched antenna on super 35 mm tape is approximately 100 μm. (As used herein, the term "pitch" may refer to the spacing between adjacent conductive tracks, rather than its conventional meaning the center-to-center dimension between track centerlines or the number of tracks per unit length.)

As mentioned above, with reference to FIG. 1D, some exemplary and/or approximate dimensions, materials and specifications may be:

Module Tape (MT): epoxy-based tape (or Kapton), 75 μm-110 μm thick
  Chip Module (CM): NXP SmartMx or Infineon SLE66, or other
  Antenna Module (AM): 13 mm×11.8 mm and 195 μm thick
  Module Antenna (MA): several windings of 50 μm or 80 μm copper wire, approximately the size of the chip module CM (and not greater in size than the AM)
  Card body CB: 85.6 mm×53.97 mm, 760 μm thick, polycarbonate (PC). The card body and its card antenna are significantly (such as 30 times) larger than the chip module CM and its module antenna MA.
  Card Antenna CA: 7 turns of 112 μm copper, self-bonding wire, ultrasonically embedded in the card body CB.

Some Solutions

A 6 pin (pad) dual interface (DI, DIF) module offers many advantages over an 8 pin module. Because of its reduced size in comparison to the 8 pin DIF module, there are cost savings in terms of the amount of gold which is required on the surface of each contact pad (copper, nickel gold), the milling time to produce a cavity in a card body is reduced because of the smaller space required to accommodate and protect the die, and the gold wires (Ø 24-32 μm) for wire bonding are no longer possible. Because of its smaller footprint, there is more space on the card body after insertion of the module for printing of brand logos and the embossing of character lines. Also, by virtue of being smaller than an 8 pin module, a 6 pin module can better survive card body flexing.

However, due to the small footprint (11.8 mm×8.8 mm) of a 6 pin (pad) DIF module, it is virtually impossible to produce a functional etched antenna on the bond side (chip side) of the module. As discussed above the circumference space (area) between the chip and the perimeter of the chip module is insufficient to contain the etched antenna tracks for inductive coupling. Additionally, because of its small footprint, it is not possible to wire bond the silicon die (chip CM) to the chip module (carrier tape MT) as the spacing between the silicon die and perimeter is insufficient to perform a ball and wedge bond.

As mentioned above with respect to FIG. 6A, rather than wire-bonding the chip CM to the vias (as in FIG. 7A), the chip CM may be flip-chip (ball) bonded to selected traces in the bottom metal layer MB which are associated with those vias. Underfiller may be provided under (on top, as viewed) of the chip CM to support it on and secure it to the module tape MT. Although flip-chip bonding may free up some space for the module antenna MA, wire wound antennas may make better use of the available space than etched antennas.

As described above (FIG. 4E), a winding core or ring (oval, round, rectangular) may be used to contain the flow of the glob top after wire bonding, while at the same time the ring is used as a supporting frame for a wire wound coil produced using the flyer principle of coil winding The ring frame (winding core WC) may advantageously be used to flatten & stiffen the chip carrier tape to protect the flip chip bonds from flexing during normal use and when the card is inserted into a card terminal. Additionally, the ring frame (winding core WC) may advantageously be used firstly to keep the contact pad surfaces substantially homogenous and substantially completely flat. The flatness may determine the longevity of the card, especially when inserted regularly into a card terminal. The winding core (WC) may stiffen, stabilize and planarize the module tape (MT), particularly in the area of the chip (CM) to enhance reliability.

Because of the reduced footprint of a 6-pad module, the only reliable method to produce an inductive coupling module may be to use a wire wound coil (with several layers) mounted to a chip carrier tape having a die mounted to its surface by means of flip chip bonding. The wire wound coil, serving as the module antenna MA, may be wound on a winding core WC that is already mounted to the substrate tape MT, as described above with respect to FIGS. 4A-4F. Alternatively, the coil may first be wound on the core, then the coil with core may be mounted to the substrate tape MT.

Figure 9:
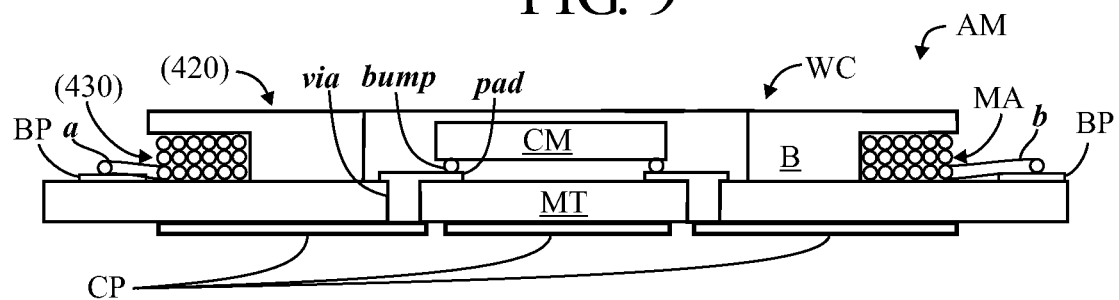
FIG. 9 is a cross-sectional view of a flip-chip antenna module (FCAM).

FIG. 9 (compare FIG. 4D) shows an antenna module AM, wherein the chip CM (compare 110) is installed on one side (the chip side) of the module tape (or substrate) MT in an interior area of the winding core WC which may have previously been mounted to the chip side of the substrate MT. In contrast with the previously described technique (FIG. 4D) of wire bonding the chip CM to bond pads on the chip side of the module tape, in this embodiment the chip is flip-chip mounted and connected to conductive traces and pads on the chip side of the substrate MT, such as in the manner described hereinabove with respect to FIG. 6A or FIG. 8B, for example.

A wire module antenna MA may be wound on the winding core WC, in the manner described hereinabove (FIG. 3), either before or after mounting the chip CM, with the winding core WC already in place on the chip side of the substrate MT. (The module antenna MA is shown here having 3 layers, 6 turns each, neatly stacked, for illustrative purposes only. The wires need not be so neatly stacked, and there may be other than 18 turns.) Alternatively, a wire module antenna MA may first be wound on the winding core WC, or a modified version thereof, and subsequently attached to the chip side of the substrate MT. Subsequently, the ends (a, b) of the module antenna MA may be bonded to bond pads BP on the chip side of the substrate MT, if they were not previously connected.

In the FIG. 9 embodiment, the chip CM may be mounted and bonded to the substrate MT prior to affixing the winding core WC to the substrate MT, and thereafter winding the antenna MA on the winding core WC. Alternatively, the winding core WC may be mounted to the substrate MT before mounting and bonding the chip CM. In the FIG. 4 embodiment, the chip CM may be mounted to the substrate MT before mounting the winding core WC, then connected afterwards.

The opposite surface of the substrate MT may be provided with contact pads for ISO-7816, such as six contact pads (see FIG. 8E). When module tape or substrate is referred to, this typically means an epoxy glass tape, copper clad on both sides (double-sided).

As set forth above, the winding core WC may have the following dimensions (approximate):
  thickness t of the body portion B=~0.85 mm
  width fw of the flange F=~0.5 mm
  outer diameter OD of the winding core WC (including flange F)=~9.4 mm
  inner diameter ID of the winding core WC=~6.7 mm
  height h1 of coil winding area=~0.250 mm
  height h2 of the flange F=~0.100 mm
  overall height h3 of the body portion B=~0.350 mm In contrast with the winding core WC of FIG. 4D, the winding core WC of FIG. 9 may be smaller overall—namely smaller OD and smaller ID. Firstly, it may be smaller because of the 6-pad versus 8-pad contact pad layout. Secondly, because the chip CM is flip chip mounted to the substrate MT, rather than being wire bonded thereto, less space is required around the chip CM, and the ID of the winding core WC can consequently be significantly smaller. Some exemplary OD and ID dimensions for the winding core WC of FIG. 9 may be:
  outer diameter OD of the winding core WC=~7 mm, such (for rectangular) 6.5×7.7 mm
  inner diameter ID of the winding core WC=~4 mm, such as (for rectangular) 3.7×4.5 mm As set forth above, the coil winding area between the flange F and the surface of the module tape MT may accommodate (contain) approximately 20 turns of 112 μm diameter self-bonding wire for the module antenna MA. Wire having other diameters, greater or less than 112 μm may be used for the module antenna MA.

After the antenna MA and chip CM are mounted and connected, the interior area of the winding core WC may be filled with glob-top potting compound GT, or the like, to protect the chip CM. If heat is applied to cure the glob-top GT, the heat may also cause sticking together of the self-bonding wire forming the turns (coils) of the module antenna MA. (Compare FIG. 4E)

Thereafter, a mold mass MM may be formed (by overmolding) over the module antenna MA, the ends (a, b) of the module antenna MA, the winding core WC, and the glob-top GT (including over the chip CM). The mold mass MM may extend over the outer edge (lip) of the flange F, slightly into the coil winding area (except where there is wire), which may helping retain the mold mass MM in place. (Compare FIG. 4F)

Improving Flip-Chip Bonding

Traditional flip-chip mounting involves providing a chip with re-flowable bumps such as solder balls, flipping the chip onto a substrate having pads, and re-flowing the solder balls, using heat, to effect the electrical (and mechanical) connection between the chip and the substrate. The Infineon FCOS chip module mentioned above utilizes an adhesive technology (such as DELO-MONOPOX or DELO-MONOPOX AC) to effect the connections between the chip and the substrate.

The brochure "Adhesives for flip chip bonding", by DELO, incorporated by reference herein, which discloses pressing of bumps and electrically conductive particles in the adhesive being clamped between bumps and substrate metallization. Process steps may include (i) adhesive application, (ii) placement of the flip-chip, (iii) curing by thermode with pressure and temperature, and optionally (iv) final curing in tunnel oven. Gold-plated nickel particles or silver particles are used as filler for the adhesive (DELO-MONOPOX AC) in order to achieve the electrical conductivity. These solid particles are used for contacting flip-chips with flexible and rigid substrates. When pressing the particles, the oxide layers on the surfaces of metallic circuit paths are ruptured. (Remaining adhesive which is not pressed may remain non-conductive.) With this, low contact resistances can also be achieved on copper and aluminum circuit paths. When manufacturing smart card modules, flip-chips are an economic alternative to the chip-on-board technology. DELO-MONOPOX or DELO-MONOPOX AC are used on standard substrates like FR4 or PET for contacting flip chips.

In an exemplary manufacturing process, substrate tape may be purchased from one vendor (such as Interplex), bumped chips may be purchased from another vendor (such as NXP), and the chips are joined and connected with the substrate using a selectively-conductive adhesive containing suitable electrically conductive particles (such as copper, nickel, gold, and the like). As used herein, a "selectively conductive adhesive" is an adhesive, such as DELO-MONOPOX or DELO-MONOPOX AC, that becomes conductive only at areas where pressure is applied. Conductive areas of the adhesive are shown as shaded, in FIG. 10. Other adhesives, such as those which are conductive, may be used to connect the bumps to the pads, such as by applying only to those areas.

Figure 10:
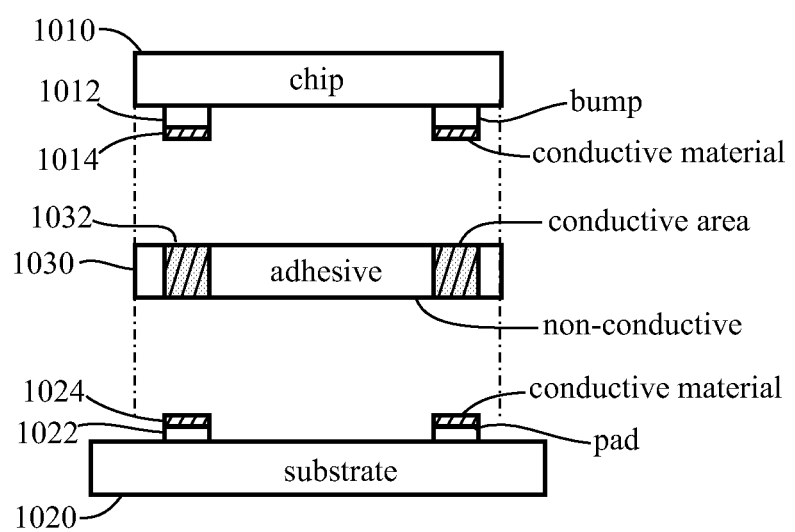
FIG. 10 is an exploded cross-sectional view of a technique for flip-chip mounting a chip to a substrate.

FIG. 10 shows a chip (CM) 1010 having two bumps 1012 and a substrate (MT) 1020 having two corresponding pads 1022. A "selectively conductive adhesive" 1030 is disposed between the chip 1010 and the substrate 1020. When the chip 1010 is pressed down onto the substrate 1020, selected areas (portions) 1032 of the adhesive 1030 become conductive, the remaining area of the adhesive remains non-conductive. In this manner, the adhesive 1030 secures (mechanically connects) the chip 1010 to the substrate 1020, and electrical connections are made between the bumps 1012 and corresponding pads 1022.

To enhance the electrical connections between the bumps 1012 and the pads 1022, as a precursor to performing flip-chipping, a conductive material may be applied to the bumps 1012 of the chip and/or to the pads 1022 of the substrate. A quantity 1014 of conductive material is shown on the bumps 1012, a quantity of conductive material 1024 is shown on the pads 1022. An exemplary conductive material is silver nanowires, such as 100 μm long, which will form a network (mesh) on the bump and/or pad surface(s) to improve mechanical and electrical connection between the bumps and the pads. Silver nanowire material is available from Seashell Technology (http://www.seashelltech.com/nanoRods.shtml), incorporated by reference herein, and may be applied to one or both of the bumps and the pads by spraying, inkjet application, aerosol application, and the like.

As an alternative to adhesive bonding, conventional flip-chip bonding, involving re-flowing solder bumps, may be used to mount and connect the chip (CM) to the substrate (MT).

Antenna Substrate (AS)

In FIG. 8C it was shown that the area for the antenna MA was limited to a peripheral area of the module substrate MT, the central area of the module substrate MT being utilized by the chip CM and its associated interconnects (and vias). One end of the antenna MA terminated at a pad (via) near the edge of the module substrate MT, the other end of the antenna MA was shown as terminating on a pad (via) under the chip CM.

Figure 11:
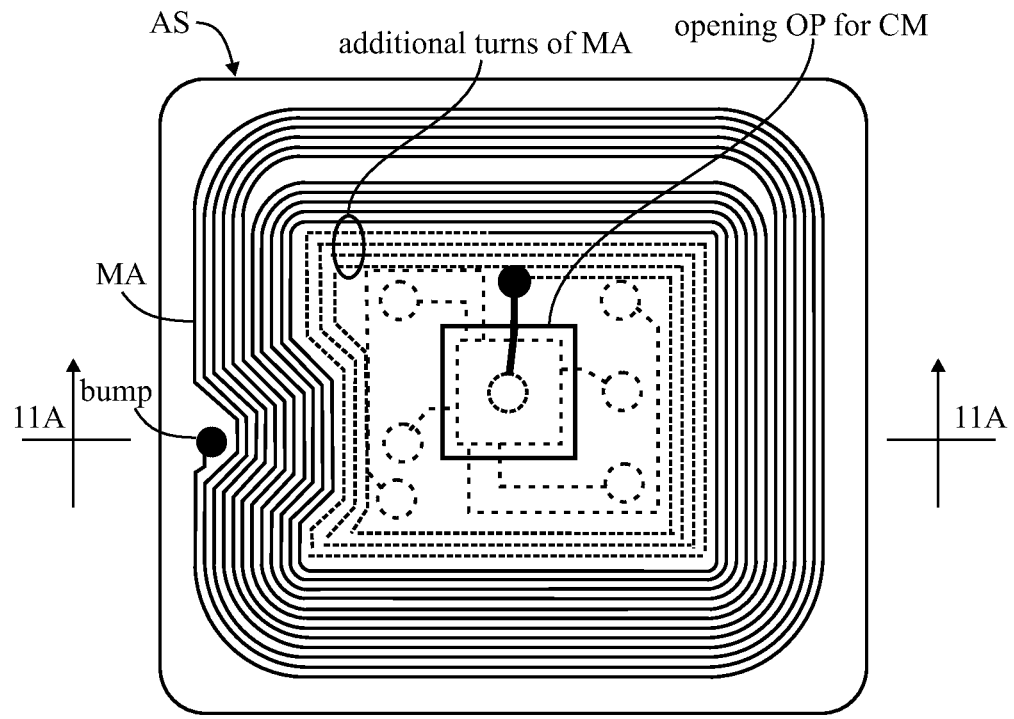
FIG. 11 is a plan view of an antenna substrate (AS).
Figure 11A:
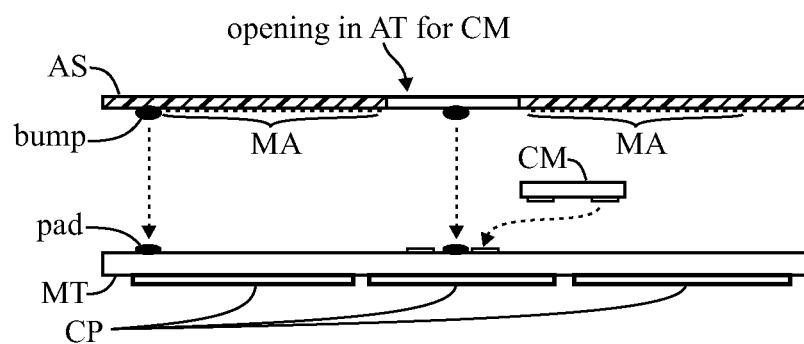
FIG. 11A is a cross-sectional view taken on a line 11A-11A through FIG. 11.

FIGS. 11 and 11A illustrate that the antenna MA may be formed on an antenna substrate AS (or tape layer) which is substantially the same size as the module substrate MT (or tape layer) and separate from the module substrate MT.

An opening OP in the antenna substrate AS, which may be only slightly larger than the chip CM, may be provided through the antenna substrate AS for accommodating the chip CM (the chip CM may protrude through the opening OP) when the antenna substrate AS is joined (and connected) to the module substrate MT. In FIG. 11, the chip CM and its interconnections (compare FIG. 8C) are shown in dashed lines.

As best viewed in FIG. 11A, the antenna substrate AS may be and may have bumps on its bottom (as viewed) surface which will be connected with corresponding pads on the top (as viewed) surface of the module substrate MT, such as by using a conductive adhesive (compare FIG. 10, 1030). The bumps (which may be pads) are shown as filled circles in FIG. 11.

By avoiding the problem of leaving the area around the chip CM free for interconnects (compare FIG. 8C), this area can be used for additional turns (or tracks) of the antenna MA. Some of these additional tracks are shown in dashed lines in FIG. 11.

The antenna substrate AS may be opaque, or dark in color to conceal the underling module substrate MT, chip CM and antenna MA. This may be an important security feature if the module substrate MT is transparent (such as parlex).

The antenna MA may be formed of wire, embedded in the antenna substrate AS, such as shown in U.S. Pat. No. 6,233, 818. Alternatively, the antenna MA may be chemically etched from a metal layer (foil) on the antenna substrate AS (compare FIG. 8C).

Alternatively, the antenna MA may be laser etched, which may allow for finer pitch, and more tracks. For example, the antenna may be laser etched (isolation technique) into a copper cladded "seed" layer (face-down side of the pre-preg) having a thickness of 17 µm, using a UV or Green nanosecond or picosecond laser with a distance between tracks dimensionally equal to the width of the laser beam, approximately 25 µm. After the laser etching of the copper seed layer, the antenna substrate AS may further be processed by one or more of sand blasting to remove residual laser ablated particles and to prepare for plating adhesion; depositing carbon to support the through-hole plating of the vertical interconnects; dry film application and photo-masking process; electroless deposition copper (Cu ~6 µm) to increase the thickness of the tracks; electro-plating of nickel and nickel phosphorous (Ni/NiP ~9 µm) or nickel (Ni ~9 µm) and palladium/gold or gold (Pd/Au or Au –0.1 µm/0.03 µm or 0.2 µm) to prevent oxidization.

U.S. Pat. No. 7,229,022 and US 2008/0314990, both of which are incorporated by reference herein, disclose an array of antennae are installed on a separate substrate to the substrate hosting the RFID chips with an identical format. The antenna substrate is then placed over the substrate with the array of RFID chips and the termination areas of each antenna are manually connected to each chip on the respective transponder site.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. An antenna module (AM) for a smart card (SC) comprising:
    a substrate (MT);
    a chip (CM) disposed on a surface of the substrate (MT) and flip-chip connected to pads on the surface of the substrate (MT); and
    an antenna (MA) disposed on the surface of the substrate (MT), and connected with the chip (CM);
    characterized by:
    a support structure (DS, WC) secured to the surface of the substrate (MT), serving as a winding core for the antenna (MA);
    wherein the support structure (DS, WC) comprises a tubular body portion (B) having two opposite open ends, one of which is secured to the surface of the substrate (MT), the other of which is a free end; and
    wherein the support structure serves as a dam for glob-top (GT) covering at least the chip (CM) within the support structure.

2. The antenna module (AM) of claim 1, wherein:
    the support structure (WC) has a flange (F) disposed around the free end of the body portion (B).

3. The antenna module (AM) of claim 1, further comprising:
    a mold mass (MM) covering the chip (CM), the support structure (DS, WC) and the antenna (MA).

4. The antenna module (AM) of claim 1, further comprising:
    contact pads (CP) on an opposite surface of the substrate (MT) for a contact interface.

5. A smart card (SC) comprising the antenna module (AM) of claim 1, and further comprising:
    a card body (CB);
    a booster antenna (BA) having an outer portion disposed around a periphery of the card body (CB); and
    a coupler coil (CC) disposed at an interior area of the card body (CB);
    wherein the antenna module (AM) is disposed at the interior area of the card body (CB) for inductive coupling of the antenna (MA) with the coupler coil (CC).

6. The smart card (SC) of claim 5, wherein:
    a recess (R) is provided in the card body (CB) for receiving the antenna module (AM).

7. A method of making an antenna module (AM) comprising:
    flip chip mounting and bonding a chip (CM) to a substrate (MT);
    characterized by:
    affixing a tubular support structure (DS, WC) having two opposite open ends on a surface of the substrate (MT); and
    after affixing the tubular support structure on the surface of the module tape (MT), winding a wire for an antenna (MA) around the tubular support structure (DS, WC).

8. The method of claim 7, further comprising:
    prior to mounting and bonding the chip to the substrate, applying a conductive material to at least one of bumps on the chip and pads on the substrate.

9. The method of claim 8, wherein:
    the conductive material comprises silver nanowires.

10. The method of claim 7, further comprising:
winding the antenna (MA) using a flyer winding technique.

11. An antenna module (AM) suitable for being disposed in a card body (CB) of a smart card (SC) comprising:
a module substrate (MT); and
a chip (CM) disposed on a surface of the module substrate (MT);
characterized by:
an antenna (MA) disposed on an antenna substrate (AS) which is separate from the module substrate (MT);
an opening (OP) in the antenna substrate (AS) for accommodating the chip (CM) when the antenna substrate (AS) is joined to the module substrate (MT).

12. The antenna module (AM) of claim 11, wherein:
the chip (CM) is and flip-chip mounted and connected to module substrate (MT).

13. The antenna module (AM) of claim 11, wherein:
the antenna (MA) comprises wire embedded in the antenna substrate (AS).

14. The antenna module (AM) of claim 11, wherein:
the antenna (MA) is etched from a metal layer on the antenna substrate (AS).

15. The antenna module (AM) of claim 11, wherein:
etching is performed using a laser.

\* \* \* \* \*